(12) United States Patent
Eden et al.

(10) Patent No.: US 9,390,894 B2
(45) Date of Patent: Jul. 12, 2016

(54) MODULAR MICROPLASMA MICROCHANNEL REACTOR DEVICES, MINIATURE REACTOR MODULES AND OZONE GENERATION DEVICES

(71) Applicant: The Board of Trustees of the University of Illinois, Urbana, IL (US)

(72) Inventors: J. Gary Eden, Champaign, IL (US); Min Hwan Kim, Urbana, IL (US); Jin Hoon Cho, Champaign, IL (US); Sung-Jin Park, Champaign, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 0 days.

(21) Appl. No.: 14/495,306

(22) Filed: Sep. 24, 2014

(65) Prior Publication Data

US 2015/0270110 A1    Sep. 24, 2015

Related U.S. Application Data

(60) Provisional application No. 61/881,741, filed on Sep. 24, 2013.

(51) Int. Cl.
*B01J 19/08* (2006.01)
*H01J 37/32* (2006.01)
(Continued)

(52) U.S. Cl.
CPC ......... *H01J 37/32568* (2013.01); *A23L 3/3445* (2013.01); *A23L 3/34095* (2013.01); *B01J 19/0093* (2013.01); *C01B 13/10* (2013.01);
(Continued)

(58) Field of Classification Search
CPC ............ H01J 61/04; H01J 17/04; H01S 3/091
USPC .......................... 372/61, 62, 69, 76; 438/699
See application file for complete search history.

(56) References Cited

U.S. PATENT DOCUMENTS 6,016,027 A * 1/2000 DeTemple .......... G03F 7/70016
                                                                       313/356
6,392,313 B1   5/2002 Epstein et al.
(Continued)

OTHER PUBLICATIONS

Cho, J.H., et al. "Propagation and decay of low temperature plasma packets in arrays of dielectric microchannels", Applied Physics Letters, 101, (2012), pp. 253508-1-253508-5.
(Continued)

*Primary Examiner* — Caleb Henry
(74) *Attorney, Agent, or Firm* — Greer, Burns & Crain, Ltd.; Steven P. Fallon

(57) ABSTRACT

A preferred modular microplasma microchannel reactor device includes a microchannel array arranged with respect to electrodes for generation of plasma and isolated by dielectric from the electrodes. A cover covers a central portion of the microchannel array, while leaving end portions of the microchannel array exposed. A gas inlet and product outlet are arranged to permit flow into, through and out of the microchannel array. Reactor modules of the invention include pluralities of the modular reactor devices. The reactors devices can be arranged by a housing or a frame to be in fluid communication. A system of the invention arranges pluralities of modules. Preferred module housings, frames and reactors include structural features to create alignments and connections. Preferred modules include fans to circulate feedstock and reaction product. Other reactor devices provide plasma actuation for flow.

32 Claims, 23 Drawing Sheets

(51) Int. Cl.

| | | |
|---|---|---|
| *A23L 3/3409* | (2006.01) | |
| *C02F 1/78* | (2006.01) | |
| *A23L 3/3445* | (2006.01) | |
| *B01J 19/00* | (2006.01) | |
| *H05H 1/24* | (2006.01) | |
| *C01B 13/10* | (2006.01) | |

(52) U.S. Cl.
CPC ............ *C02F 1/78* (2013.01); *H01J 37/32798* (2013.01); *H01J 37/32908* (2013.01); *H05H 1/2406* (2013.01); *A23V 2002/00* (2013.01); *B01J 2219/0081* (2013.01); *B01J 2219/0086* (2013.01); *B01J 2219/0093* (2013.01); *B01J 2219/00783* (2013.01); *B01J 2219/00806* (2013.01); *B01J 2219/00822* (2013.01); *B01J 2219/00853* (2013.01); *B01J 2219/00867* (2013.01); *B01J 2219/00869* (2013.01); *B01J 2219/00871* (2013.01); *C02F 2305/02* (2013.01); *H01J 2237/327* (2013.01); *H05H 2001/2418* (2013.01)

(56) References Cited

U.S. PATENT DOCUMENTS

| | | | | |
|---|---|---|---|---|
| 6,541,915 | B2 * | 4/2003 | Eden | H05B 41/19 313/491 |
| 6,563,257 | B2 * | 5/2003 | Vojak | H01J 17/06 313/356 |
| 6,695,664 | B2 * | 2/2004 | Eden | H01J 1/025 313/631 |
| 6,815,891 | B2 * | 11/2004 | Eden | G01N 30/64 313/356 |
| 6,828,730 | B2 * | 12/2004 | Eden | H01J 47/00 313/538 |
| 7,157,721 | B1 | 1/2007 | Blanchard | |
| 7,573,202 | B2 * | 8/2009 | Eden | H01J 17/066 313/306 |
| 8,442,091 | B2 * | 5/2013 | Park | H01S 3/03 372/45.01 |
| 8,547,004 | B2 * | 10/2013 | Eden | C01B 13/10 313/267 |
| 8,890,409 | B2 * | 11/2014 | Eden | H05H 1/24 205/106 |
| 2002/0036461 | A1 * | 3/2002 | Schoenbach | H01J 1/025 313/495 |
| 2003/0132693 | A1 * | 7/2003 | Eden | H01J 11/18 313/356 |
| 2003/0230983 | A1 * | 12/2003 | Vonallmen | H01J 17/04 315/111.21 |
| 2005/0161318 | A1 * | 7/2005 | Arlemark | C01B 13/11 204/176 |
| 2005/0269953 | A1 * | 12/2005 | Eden | H01J 17/40 313/582 |
| 2006/0038490 | A1 * | 2/2006 | Eden | H01J 9/241 313/582 |
| 2006/0091117 | A1 * | 5/2006 | Blankenship | B23K 10/027 219/121.47 |
| 2007/0108910 | A1 * | 5/2007 | Eden | G01N 21/73 313/631 |
| 2007/0170866 | A1 * | 7/2007 | Eden | G21F 1/106 313/631 |
| 2008/0129185 | A1 * | 6/2008 | Eden | H01J 11/12 313/485 |
| 2008/0185579 | A1 * | 8/2008 | Eden | H01J 11/18 257/43 |
| 2009/0120473 | A1 | 5/2009 | Lynn | |
| 2010/0001629 | A1 * | 1/2010 | Eden | H01J 11/18 313/484 |
| 2010/0127624 | A1 | 5/2010 | Roy | |
| 2010/0171422 | A1 * | 7/2010 | Boroczki | H01J 61/0732 313/631 |
| 2010/0296978 | A1 * | 11/2010 | Park | H01S 3/03 422/186.04 |
| 2010/0327155 | A1 * | 12/2010 | Lopez-Avila | H01J 49/162 250/282 |
| 2011/0064621 | A1 * | 3/2011 | Francis, Jr. | C01B 13/10 422/186.2 |
| 2011/0109226 | A1 * | 5/2011 | Cooley | H05G 2/003 315/111.21 |
| 2011/0260609 | A1 * | 10/2011 | Eden | H01J 17/49 313/582 |
| 2012/0025696 | A1 * | 2/2012 | Eden | H01J 9/222 313/486 |
| 2013/0071297 | A1 * | 3/2013 | Eden | H01J 37/32055 422/186.07 |
| 2014/0339677 | A1 * | 11/2014 | Eden | H01L 29/73 257/586 |
| 2015/0008825 | A1 * | 1/2015 | Eden | H05H 1/2406 315/111.21 |
| 2015/0162158 | A1 * | 6/2015 | Tabib-Azar | H01J 17/04 315/111.21 |

OTHER PUBLICATIONS

Sung, S.H., et al., "Interchannel optical coupling within arrays of linear microplasmas generated in 25-200m wide glass channels", Applied Physics Letters, 97, (2010) 231502-1-231502-3.
International Search Report Dated Jun. 24, 2015.

* cited by examiner

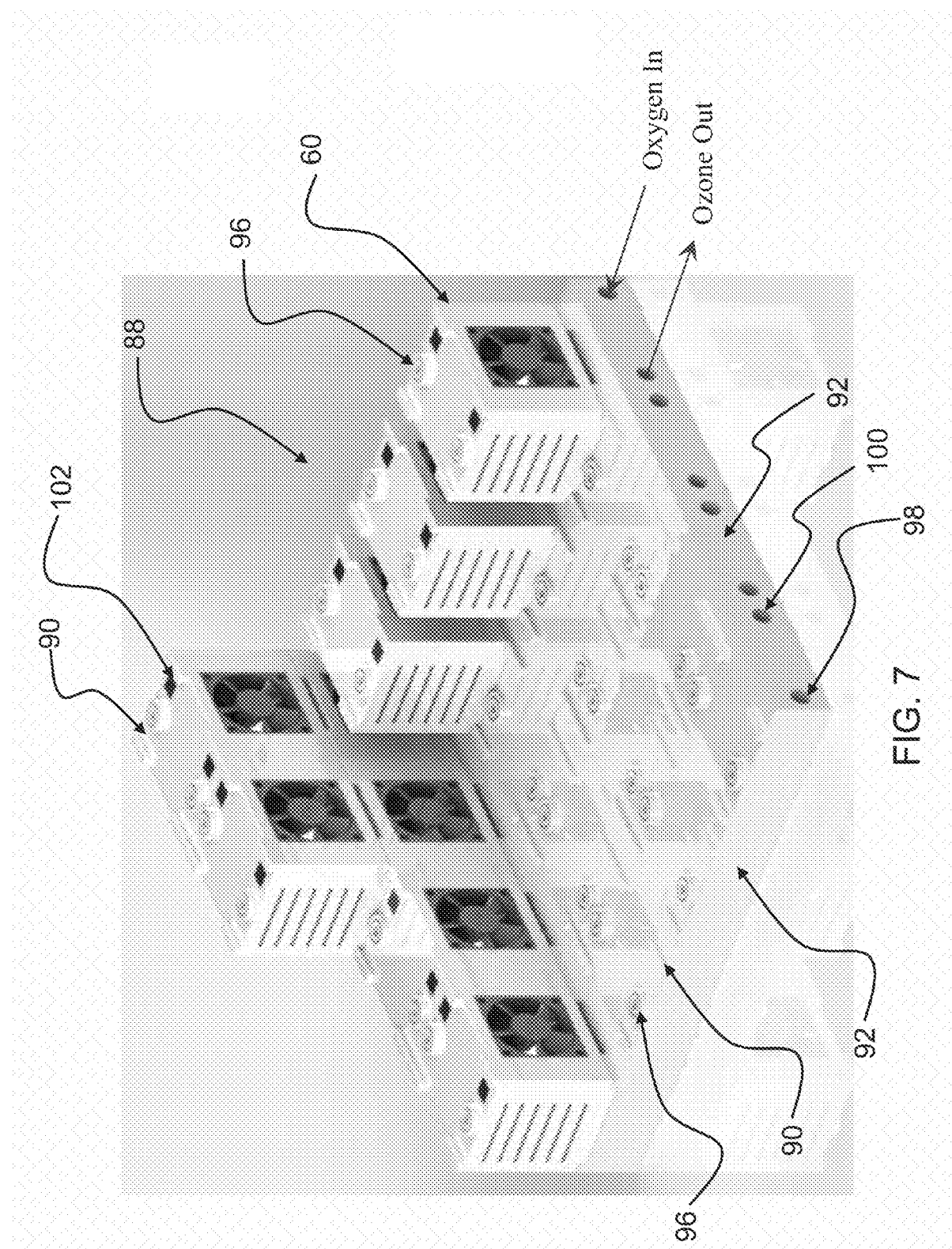

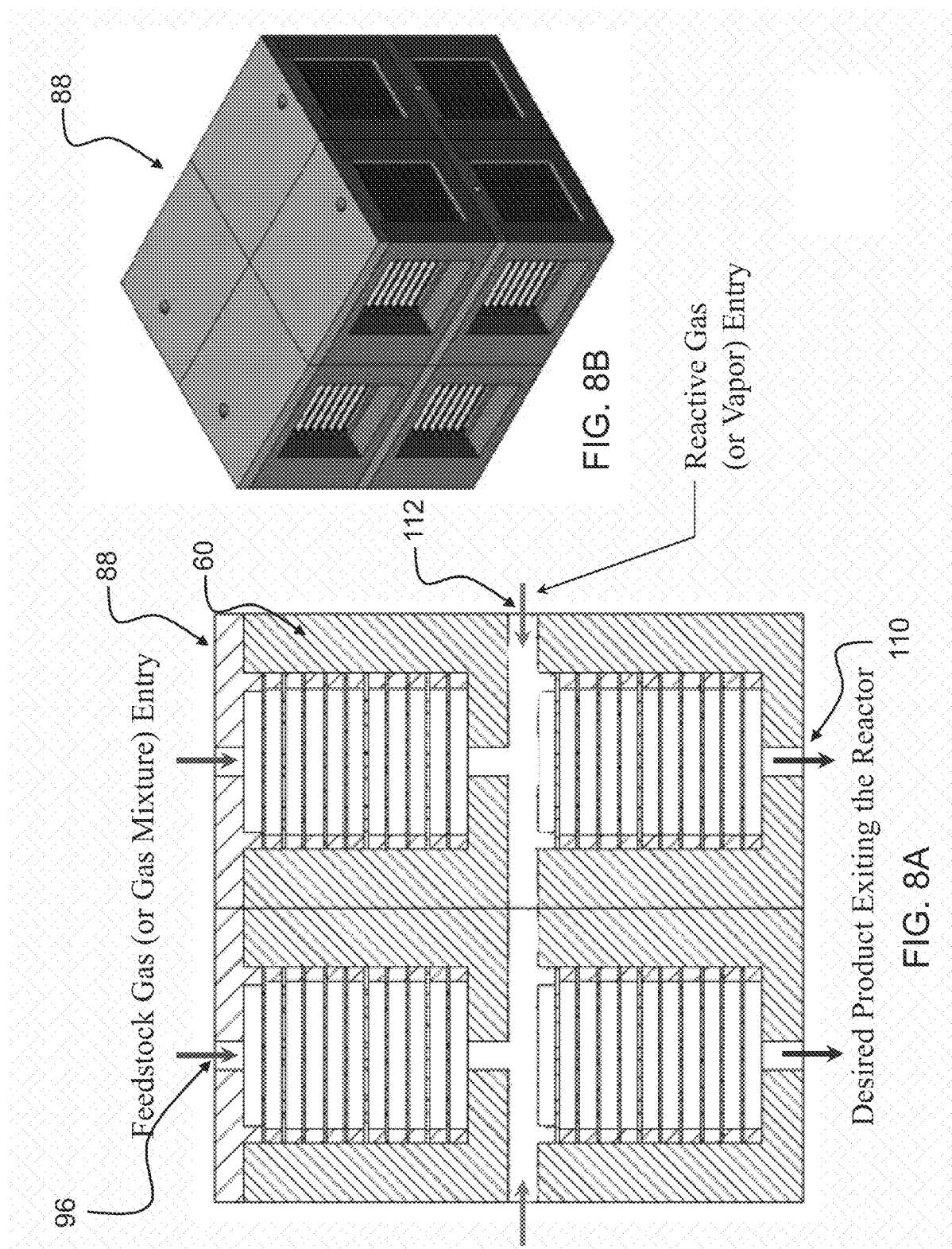

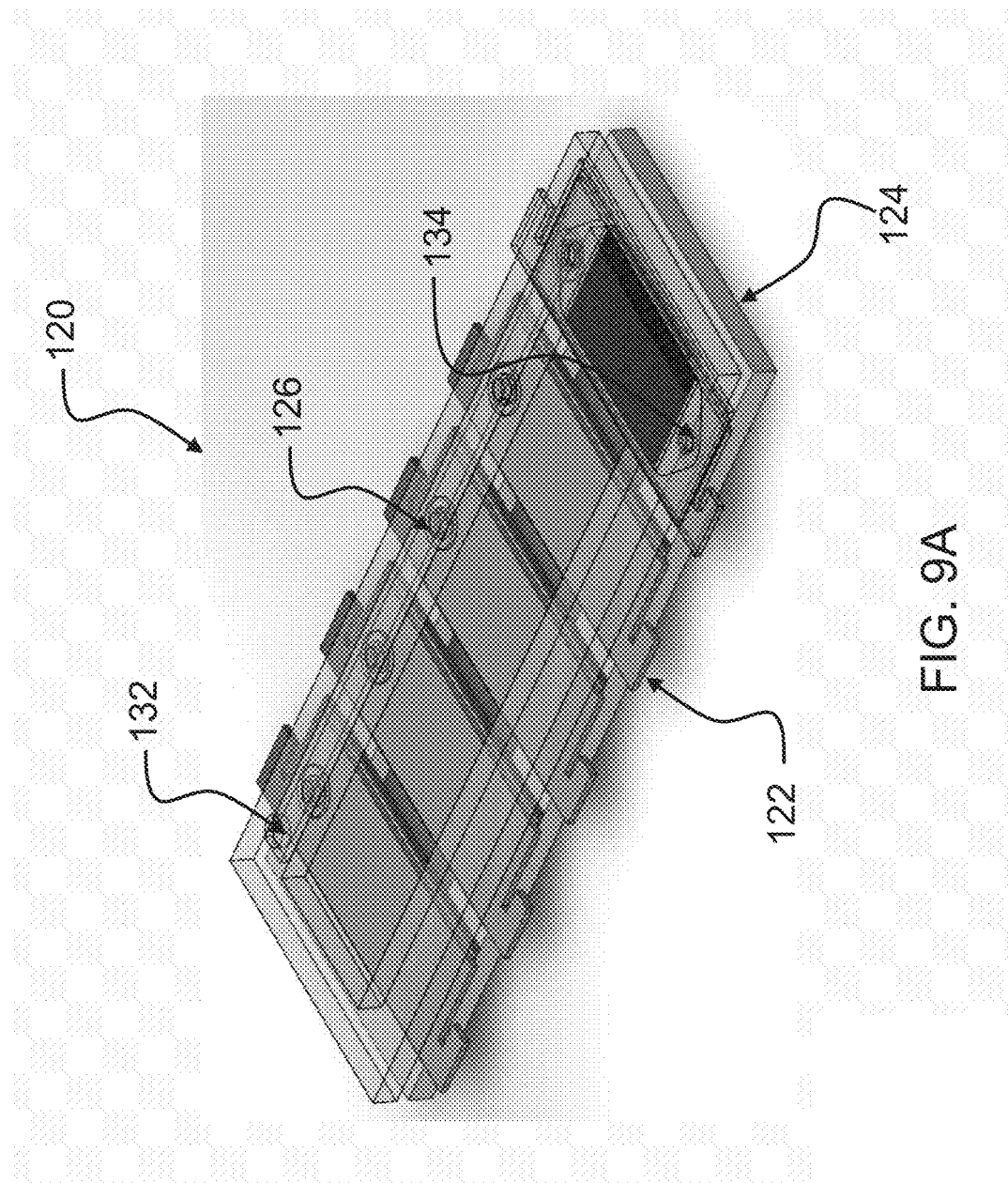

MODULAR MICROPLASMA MICROCHANNEL REACTOR DEVICES, MINIATURE REACTOR MODULES AND OZONE GENERATION DEVICES

PRIORITY CLAIM AND REFERENCE TO RELATED APPLICATION

The application claims priority under 35 U.S.C. §119 and all applicable statutes and treaties from prior provisional application Ser. No. 61/881,741, which was filed Sep. 24, 2013.

STATEMENT OF GOVERNMENT INTEREST

This invention was made with Government assistance under U.S. Air Force Office of Scientific Research grant Nos. FA9550-10-1-0048 and FA9550-12-1-0487. The Government has certain rights in this invention.

FIELD OF THE INVENTION

The invention is in the field of microchannel microplasma devices, also known as microdischarge or microcavity plasma devices. Additional fields of the invention include plasma-chemical reactors, ozone generation, and plasma chemistry. Example applications of the invention include the dissociation of gases such as carbon dioxide and oxygen, disinfection of water with ozone, and ozone generation and distribution for the preservation of food products, commercial and residential laundry (washing clothes, towels, etc. in cold water), and the disinfection of surfaces, wounds, and medical instruments.

BACKGROUND

Plasma-chemical reactors and processes seek to use plasma to initiate desirable chemical reactions. Plasma can be used to promote chemical reactions in liquids and gases, and on the surfaces of solids. Present commercial plasma systems are used for printing, for treating water and for sterilizing surfaces, for example. An impediment to the wider adoption of commercial plasma-chemical reactors is the scale and expense of conventional atmospheric pressure plasma technology. The cost, size, weight, and high voltages characteristic of typical plasma-chemical reactors limit greatly the potential of conventional plasma reactor technology. Ozone treatment is a particularly attractive application of plasma-chemical technology but the cost, size, and weight of most existing systems render them of limited value for many commercial uses.

Existing systems include electron-beam systems and discharge-based systems, such as the pulsed corona or dielectric barrier discharge (DBD) reactors. Electron beam-based systems require the creation of free electrons and their acceleration to high energies under vacuum conditions. This process typically requires high voltages (tens to hundreds of kV). The electrons are introduced into a gas reactor chamber to bombard one gas or a mixture of gases. This can produce fragmentation (dissociation) of the molecules from the gas or the gas mixture. The reaction chamber requires a robust entry point for the electron beam because this point (often a metal foil through which the electrons pass) is subjected to pressures and heat generated in the reaction vessel. High voltages of one hundred (or more) kV are generally required to accelerate the electrons so that they are able to enter the chamber. The requirements for high voltage and vacuum equipment raise the cost and complexity of these systems to a level that limits the utility of the systems.

Discharge based systems create high energy electrons directly within the treated gas volume via application of locally intense electric fields. Such plasma-chemical reactors include dielectric barrier and corona discharge systems. The discharge systems often operate at pressures of hundreds of Torr to beyond 1 atmosphere and require voltages of at least several kV and typically more than 10 kV. Both dielectric barrier systems and corona discharge systems tend to produce inhomogeneous plasmas that are characterized by streamers. The reactor volumes in these systems tend to be large (milliliters to hundreds of liters), which restricts the influence of the reactor wall on the plasma chemistry.

Ozone can be produced when oxygen (O2) molecules are dissociated by an energy source into oxygen atoms. Collisions of free oxygen atoms with oxygen molecules produce ozone (O3), which must be generated at the point of treatment because the lifetime of O3 in air at atmospheric pressure is on the order of minutes. Ozone is the strongest oxidant and disinfectant available commercially. Mechanisms of disinfection using ozone include direct oxidation/destruction of bacterial cell walls, reactions with radical by-products of ozone decomposition, and damage to the constituents of nucleic acids. Particular commercially available DBD systems for the large scale production of ozone for municipal water treatment, for example, are large (as long as 10-15 ft. in length) and have demanding power requirements (150-200 kVA). Furthermore, the conversion of feedstock gases into O3 is typically inefficient. Existing commercial processes for producing O3 in large volume typically convert 15%-18% of the oxygen (O2) feedstock gas into O3. This low efficiency for the conversion of feedstock gas to ozone is a result of the fact that ozone is produced only within, or in the vicinity of, the streamers produced in air or oxygen by DBD systems. Maintenance of such systems is also problematic owing to a large number of ceramic parts and fouling of device components by nitric acid. Existing dielectric barrier discharge technology is also sensitive to the level of organic impurities in the oxygen feedstock gas.

There are additional drawbacks to existing commercial plasma-chemical devices and systems. Dielectric barrier discharge structures are most commonly used in present day commercial systems. These uncomplicated devices apply high voltages to electrodes separated by a dielectric (often, glass or quartz). Typical macroscopic reactors rely upon microdischarge streamers that are nominally 100 μm in diameter and statistically distributed in space and time. Conversion efficiencies are low which, therefore, requires large volumes of oxygen (or air) flows to generate reasonable amounts of O3. Moisture and organic contaminants in the feedstock gas are another problem with conventional ozone generating systems because the system can be fouled and rendered less efficient, or disabled, as a result of nitric acid build up on the reactor wall or on vacuum fittings.

Research by some of the present inventors and colleagues at the University of Illinois has resulted in new microcavity and microchannel plasma device structures, as well as new applications. A particularly promising class of microcavity plasma device arrays is formed in metal and metal oxide. Large-scale, low-cost arrays of microplasma devices that can be flexible are formed by inexpensive processes with metal electrodes encapsulated in metal oxide.

One previous application and publication by several of the present inventors and colleagues has described the production of ozone in microchannels. Specifically, Park et al. U.S. Pat. No. 8,442,091 discloses microchannel lasers having a microplasma gain medium. In that patent, microplasma acts as a gain medium with the electrodes sustaining the plasma in the microchannel. Reflectors can be used in conjunction with the microchannel for obtaining optical feedback and lasing in the microplasma medium in devices of the invention for a wide range of atomic and molecular species. Several atomic and molecular gain media will produce sufficiently high gain coefficients that reflectors (mirrors) are not necessary. FIG. 4 of that patent also discloses a microchemical reactor that is suitable for air purification and ozone production because of the channel lengths and large power loadings (watts deposited per unit volume) of the plasma that are available. However, fabrication costs associated with channels of extended length present an obstacle to commercialization of this technology for applications that would benefit from ozone production.

Some of the present inventors and colleagues have developed devices that produce high quality plasmas in microchannels. For example, linear arrays of 25-200 µm wide channels have been fabricated in glass by replica molding and micropowder blasting and have been demonstrated to be capable of generating low temperature, nonequilibrium microplasmas. See, Sung, Hwang, Park and Eden, "Interchannel optical coupling within arrays of linear microplasmas generated in 25-200 µm wide glass channels," Appl. Phys. Lett. 97, 231502 (2010). Parallel microchannels have also been fabricated in nanostructured alumina ($Al_2O_3$) via a nanopowder blasting process, and shown to provide the capability for routing, and controlling the flow of, packets of low temperature, nonequilibrium plasma. See, Cho, Park and Eden, "Propagation and decay of low temperature plasma packets in arrays of dielectric microchannels," Appl. Phys. Lett. 101, 253508 (2012). Further development and research on these and additional microchannel structures by some of the present inventors and colleagues produced ozone microreactors capable of generating ozone and fragmenting gas molecules. See, [0062]-[0066] of commonly owned Eden et al., US Published Patent Application 2013/0071297, published Mar. 21, 2013. The ozone microreactor in the '297 Application included 12 microchannels that supported a flow rate of 0.5 standard liters per minute and ozone generation efficiencies exceeding 150 g/kWh.

Current technology for ozone production generally differs with the scale of ozone production required. Reactors tend to be custom-designed for particular applications. As an example, commercial reactors for ozone production for high throughput applications in municipal water treatment and pulp processing employ technology and system designs that differ considerably from those of lower production rate units. Commercial installations are often custom designed, difficult to scale, require large amounts of power, and are generally inefficient as well as sensitive to contaminants in the feedstock gas flow stream.

Several manufacturers currently offer reactors designed for kilogram/hour ozone production rates that are typical of many municipal water treatment facilities. Typical reactors include a number of cylindrical DBD plasma tubes, each of which is separately fused. Plasma produced in each tube is spatially inhomogeneous and ozone production occurs predominately in the vicinity of the streamers. On the other hand, smaller scale applications requiring lower throughput (e.g., <100 g/hr) often employ corona reactors.

A portable ozone generator is described in U.S. Pat. No. 7,157,721 ("'721 patent"). In the '721 device, both sides of a glass or ceramic plate are coated with conductive materials to form electrodes having different areas. Such a device produces a corona discharge in the region lying outside the smaller of the two electrodes. An ozone device based upon this corona discharge mixes ozone with water in flow channels that are formed in plastic. No microchannels exist in the ozone-producing reactor. Another manufacturer provides a modular approach to ozone generation that is based upon corona discharge cells. However, because the corona discharge reactors are not flat, nor is the plasma confined to microscopic channels, these reactors are not readily or easily combined and, in particular, are not amenable to being stacked. Furthermore, the voltages required of corona discharge systems are high (multi-kV) and conversion efficiencies (oxygen or air→ozone) are low.

SUMMARY OF THE INVENTION

A preferred modular microplasma microchannel reactor device includes a microchannel array of a plurality of microchannel plasma devices. The plasma devices include electrodes arranged with respect to the plurality of microchannels to stimulate plasma generation in the plurality of microchannels upon application of suitable voltage. The electrodes are isolated from the microchannels by dielectric. A gas inlet is provided to the microchannels. A gas product outlet is provided from the microchannels. A portion of the microchannels between the gas inlet and gas product outlet are covered by a cover. The cover and device are structured to be modular so as to join with additional reactor devices.

A preferred modular microplasma microchannel reactor device includes a microchannel array arranged with respect to electrodes for generation of plasma and isolated by dielectric from the electrodes. A cover covers a central portion of the microchannel array, while leaving end portions of the microchannel array exposed. A gas inlet and product outlet are arranged to permit flow into, through and out of the microchannel array.

Reactor modules of the invention include pluralities of the modular reactor devices. The reactor devices can be arranged by a housing or a frame to be in fluid (gas) communication with other reactor devices. A system of the invention arranges pluralities of modules. Preferred module housings, frames and reactors include structural features to create alignments and connections. Preferred modules include fans to circulate feedstock and reaction product. Other reactor devices provide plasma actuation for flow.

BRIEF DESCRIPTION OF THE DRAWINGS

FIG. 7 is a perspective view of a partially assembled preferred embodiment reactor system that is formed from a three dimensional array of miniature reactor modules of the invention;

FIGS. 8A and 8B are schematic and perspective views of preferred embodiment reactor system of the invention with reactive gas flow pattern features;

FIGS. 9A and 9B are, respectively, perspective partially transparent and cross-sectional views of another preferred embodiment reactor module of the invention with different gas flow pattern features;

DETAILED DESCRIPTION OF THE PREFERRED EMBODIMENTS

Figure 1:
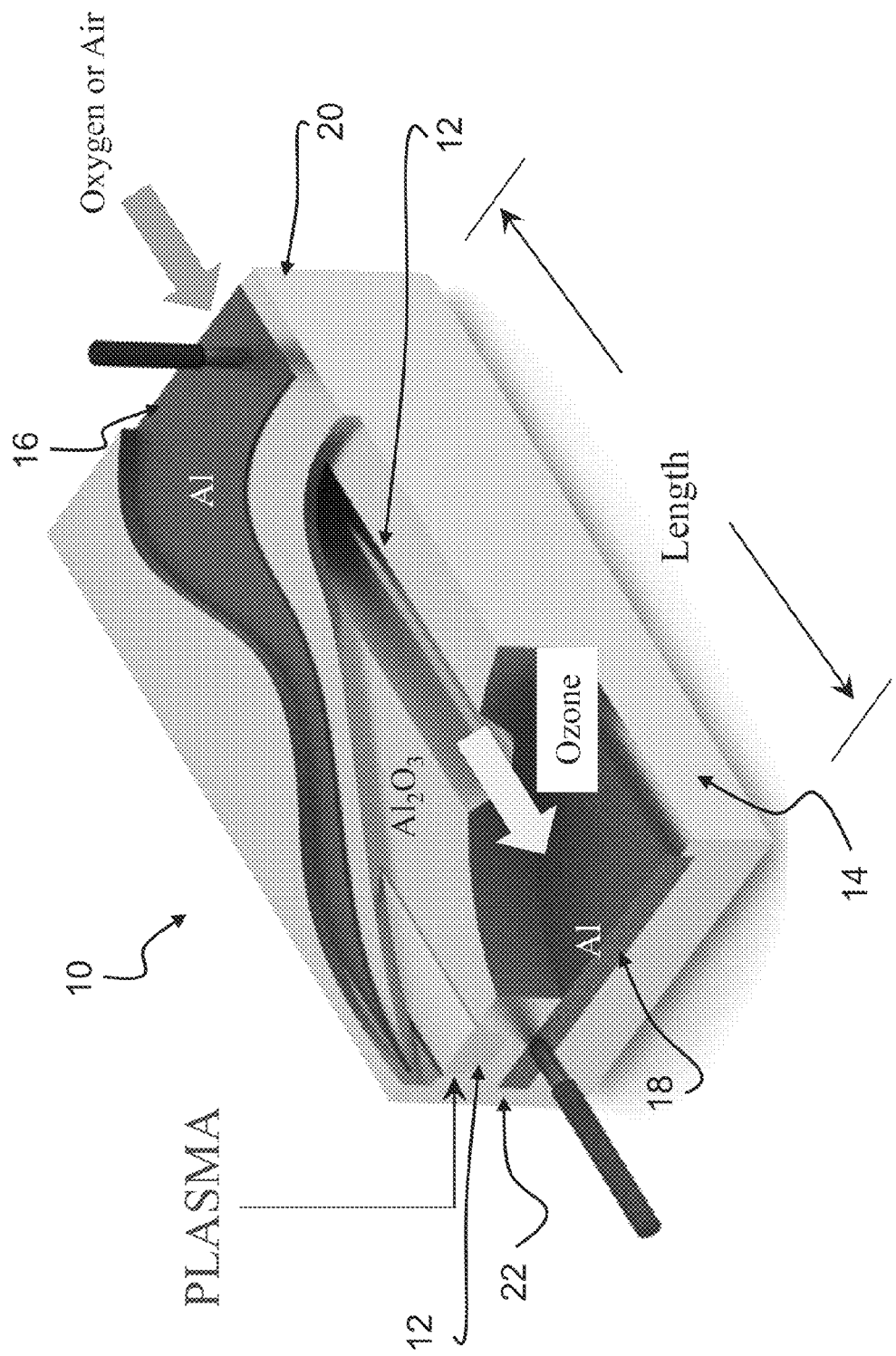
FIG. 1 is a cut-away perspective view of a preferred embodiment microchannel plasma device reactor that forms a unit of a preferred embodiment reactor module of the invention.

The invention provides modular microchannel microplasma reactors, reactor modules and modular reactor systems that include pluralities of the modular microchannel microplasma reactors and reactor modules. The reactors, reactor modules and modular systems are readily combined and scaled into large systems. The reactors, reactor modules and modular reactor systems can each provide a specific predetermined throughput, e.g., grams of product/hour. The reactors can generate ozone as an example product. In preferred embodiment ozone production modules and systems, each module and each modular system provides a respective predetermined grams per hour of ozone. Because preferred individual reactor modules can be combined through stacking, arranged along a line, etc., the present microplasma technology is readily scalable in ozone output.

For example, preferred reactor modules are configured to seal together when stacked in a frame structure of a preferred embodiment modular system with a gas-tight seal that also provides inputs and outputs from the modular system. The modules are also configured to provide electrical contacts to the electrodes of the individual microchannel microplasma reactor devices in the modules. The reactor modules and system frame structure are preferably configured to provide a predetermined registration of feedstock gas inputs, and the outputs (product outputs) for microchannel arrays in a module. The registration can be parallel or transverse to the axis of the microplasma channels in each reactor, for example. In example embodiments, each reactor includes a microchannel microplasma array with parallel microchannels. The number of channels in preferred examples is 10-50. In other embodiments, each reactor includes microchannels arranged in a radial pattern, or a spiral pattern. The fabrication methods for the microchannel arrays permit a wide variety of other channel geometries such as zig-zag and curved (e.g., sinusoidal) patterns.

Preferred reactors, modules and systems provide a highly scalable and inexpensive ozone generation solution that has also been found to have excellent lifetimes (greater than 2,500 hours for example, in experimental systems). Systems of the invention are easier to service than many commercially available ozone generation units, including popular dielectric barrier discharge units. A paradigm realized by modules and modular systems of the invention is inexpensively providing a specific desired output, measured in grams per hour, to meet the needs of a particular application. This broadens the attractiveness of ozone treatment to applications that are not served by present commercial technology, due to costs and inefficiencies of the present commercial systems. However, systems of the invention are also scalable to meet the larger ozone output applications currently served by existing ozone generation technology. The modular nature of the systems of the invention provides the ability to inexpensively scale a system to meet a particular desired output.

Preferred modular microchannel microplasma reactors of the invention include an array of microchannel plasma devices that are formed in high quality metal oxide, with excitation electrodes being buried in the wall of the microchannel, encapsulated in the oxide, and flanking the channel over much or all of its length. An input provides a gas feedstock to be treated, e.g., oxygen or air, and an output provides a reaction product, e.g. ozone. Methods for forming preferred metal and meal oxide arrays of microchannel plasma devices that are used in reactors of the invention are disclosed in commonly owned Eden et al., US Published Patent Application 2013/0071297, published Mar. 21, 2013. A microchannel array in accordance with the '197 application includes microchannels defined at least partially within a thick metal oxide layer consisting essentially of defect free oxide. Electrodes are arranged with respect to microchannels to stimulate plasma generation in the microchannels upon application of a suitable time-varying voltage and with at least one of the electrodes encapsulated within the thick metal oxide layer. Large arrays can be formed and are highly robust as a virtual absence of microcracks in the oxide serves to prevent dielectric breakdown. A method of fabricating a microcavity or microchannel plasma device of the invention includes anodizing a flat or gently curved or gently sloped metal substrate to form a thick (tens to hindreds of micrometers) layer of metal oxide which consists essentially of nanopores that are oriented perpendicular to the surface of the metal substrate. Spatially-selective material removal removes metal oxide material in specific regions of the metal oxide surface so as to form a microcavity or microchannel in the thick layer of metal oxide. Micropowder ablation is preferably used as an efficient removal process that preserves oxide quality and produces a microchannel of the desired cross-section. Other formation techniques include chemical etching methods.

Preferred materials for the thin metal electrodes and metal oxide are aluminum and aluminum oxide ($Al/Al_2O_3$). Another exemplary metal/metal oxide material system is titanium and titanium dioxide ($Ti/Ti_2O_2$). Other metal/metal oxide material systems will be apparent to artisans. Preferred material systems alternatively permit the formation of microcavity plasma device arrays of the invention by inexpensive, mass production techniques such as roll-to-roll or batch chemical processing.

Additional preferred modular microchannel microplasma reactor modules of the invention include an array of microchannel plasma devices that is formed in polymer with excitation electrodes being buried and encapsulated in the polymer. Methods for forming the arrays of microchannel plasma device arrays are disclosed in commonly owned Eden et al., U.S. Pat. No. 8,497,631. A replica molding process produces microchannels in polymers. Either of the polymer or metal/metal oxide microchannel arrays can have microchannel cross-sections optimized to a specific shape.

An individual reactor of the invention provides a compact and lightweight microplasma chemical reactor with an array of microchannel plasmas, and is scalable in throughput (product output per hour). Combining individual modular reactors into modules and systems can provide scalable, massively-parallel processing of gases and vapors using the same technology for different ranges of reactor system sizes (i.e., product generation rates). The invention thus provides a scalable paradigm for the plasma processing of gases (or vapors) in which the desired chemical product (such as ozone) is produced in hundreds or thousands of microchannels. Reactor systems of virtually any size (product output per hour) are realized by incorporating the number of reactor modules necessary for a specific application. The cost of ozone production can, therefore, be reduced for many applications such as the disinfection of water for drinking, cleaning of clothes, towels, etc. in commercial laundries, and water treatment in residential and commercial swimming pools. Ozone production is realized by introducing oxygen or air into the microchannels as the feedstock gas.

The microchannel plasma reactors, reactor modules and reactor systems are also capable of efficiently producing chemical products other than ozone. For example, carbon dioxide (or other gases that are environmentally unfriendly or hazardous) can be dissociated (fragmented) efficiently in arrays of microchannel plasmas. Dissociation of carbon dioxide can also be combined with feedstock chemicals such as water or methane to produce valuable commodities such as formic acid, syngas, or methanol.

Another preferred embodiment modular design miniature reactor provides low profile, flat reactor sheets that can yield a compact package when combined into reactor modules. Another preferred plasma miniature reactor provides a microchannel plasma network in a ladder configuration that has been demonstrated in experiments to produce ozone more efficiently than a comparable reactor having only parallel channels.

The invention also provides modular microchannel plasma systems for producing and distributing ozone. Example ozone producing and distribution systems of the invention can include a microchannel sprayer plate that joins to a reactor module and distributes ozone in a pattern and direction defined by the microchannels in the sprayer plate. Such dispersion/spray ozone systems will be particularly beneficial for the food storage and distribution industry. Systems of the invention can be powered by small and portable power supplies, e.g. using small batteries (any 9 to 12V battery as an example) and DC to AC inverters with up converting transformers in example embodiments, that can support several ozone generators of the invention. Miniature reactor/ozone modules of the invention can also be manufactured to be sufficiently small to be affixed to the inside of a food package, e.g., a plastic bag that encloses a high value food product of interest. Experimental reactors have been powered by batteries and voltage multipliers in food packages. In such an application, the miniature reactor converts a fraction of the oxygen in the gaseous volume surrounded by the packaging into ozone to destroy bacteria on the surface of the food product, thereby extending its shelf life. The reactor need only run periodically for small amounts of time, and the total power required is small. Example experimental food package embodiments operated with 1 to 2 Watts of power.

Miniature reactor modules and systems of the invention can have a fan incorporated into their housings, and arrays of reactor systems can, therefore, provide a self-contained package that provides a desired flow of the product gas (such as ozone). In another embodiment, the microplasma reactor array is configured in an actuator arrangement, in which the plasma itself serves to pull ambient air into the reactor and propel the air/ozone product out of the reactor. In such an embodiment, no fan is necessary, which further reduces the cost and weight of the miniature reactor system or arrays of the miniature reactor system.

In addition to food preservation, miniature ozone systems of the invention are well-suited, for example, for the disinfection of water in hot tubs, air purifiers, and other applications having a low ozone generation requirement.

Reactor systems of the invention require voltages considerably lower than those typical of existing technology to generate ozone. Embodiments of the invention also provide reactors of low weight and cost.

Preferred embodiments will now be discussed with respect to the drawings. The drawings include schematic figures and partial views that are not to scale, but which will be fully understood by skilled artisans with reference to the accompanying description. Features may be exaggerated for purposes of illustration. From the preferred embodiments, artisans will recognize broader aspects of the invention.

The preferred embodiments will be illustrated with respect to the preferred Al/Al$_2$O$_3$ materials system, and experiments that were conducted with experimental devices. As mentioned above, other metal and metal oxide systems can be used, and other suitable materials for the microchannel arrays include polymers, glasses and ceramics.

FIG. 1 illustrates a cutaway portion of a microchannel plasma reactor device 10 that is the basic unit of a preferred reactor module of the invention. Portions of only two microchannels 12 are illustrated, whereas a typical individual reactor device will have 12-50 microchannels. The microchannels 12 are formed in a high-quality metal oxide 14, formed of two layers of metal oxide, which is preferably nanoporous alumina in the illustrated embodiment. Aluminum electrodes 16, 18, are embedded in the layers and are responsible for producing low temperature plasma in the microchannels 12. One of the layers can include the microchannels 12, or the microchannels 12 can be formed in an additional layer with the metal oxide buried electrodes 16, 18 sheets lying below and above the microchannels 12. In other embodiments, the Al electrodes 16, 18 can be buried in the metal oxide 14 (through an electrochemical process) and oriented so as to run parallel to the microchannels 12. Although more difficult to fabricate, microchannel plasma devices having the electrodes buried in the microchannel wall exhibit lower capacitance than the parallel sheet structure of FIG. 1. The reactor 10 of FIG. 1 can have a predetermined desired length. Example lengths, which define the length of the microchannels, are 1 to 5 inches. In other embodiments, such as for food package applications, the length of the microchannels is a fraction of an inch, e.g. 0.5 inches, or about the size of a U.S. quarter dollar or a one Euro coin.

The voltage to be supplied to the electrodes 16, 18 must be time-varying because the plasma generated within the microchannels is physically and electrically isolated from both electrodes. Feedstock gas (air or oxygen if the desired product is ozone) is introduced at one gas inlet end 20 of the microchannel array and the desired product emerges from the other product outlet end 22. The inlet 20 and outlet 22 provide flow of gas into and out of the microchannels 20. An upper portion of the metal oxide 14 forms a cover to contain flow. The cover is configured structurally to be modular and arranged with other reactors. Depending upon the efficiency of the conversion process, the effluent leaving the microchannel array will also contain unreacted feedstock gas. The length of the microplasma reactor chip is typically 0.5-5 inches as mentioned above, but can be much shorter or longer for specific plasma-generated products. Contacts to the electrodes 16,18 are conceptually illustrated in FIG. 1. Features of the electrodes 16,18 and oxide 14 permit stacked connection in preferred embodiment reactor devices, i.e., electrical connections are established between devices when they are stacked or otherwise arranged to make physical contact.

Figures 2A, 2B:
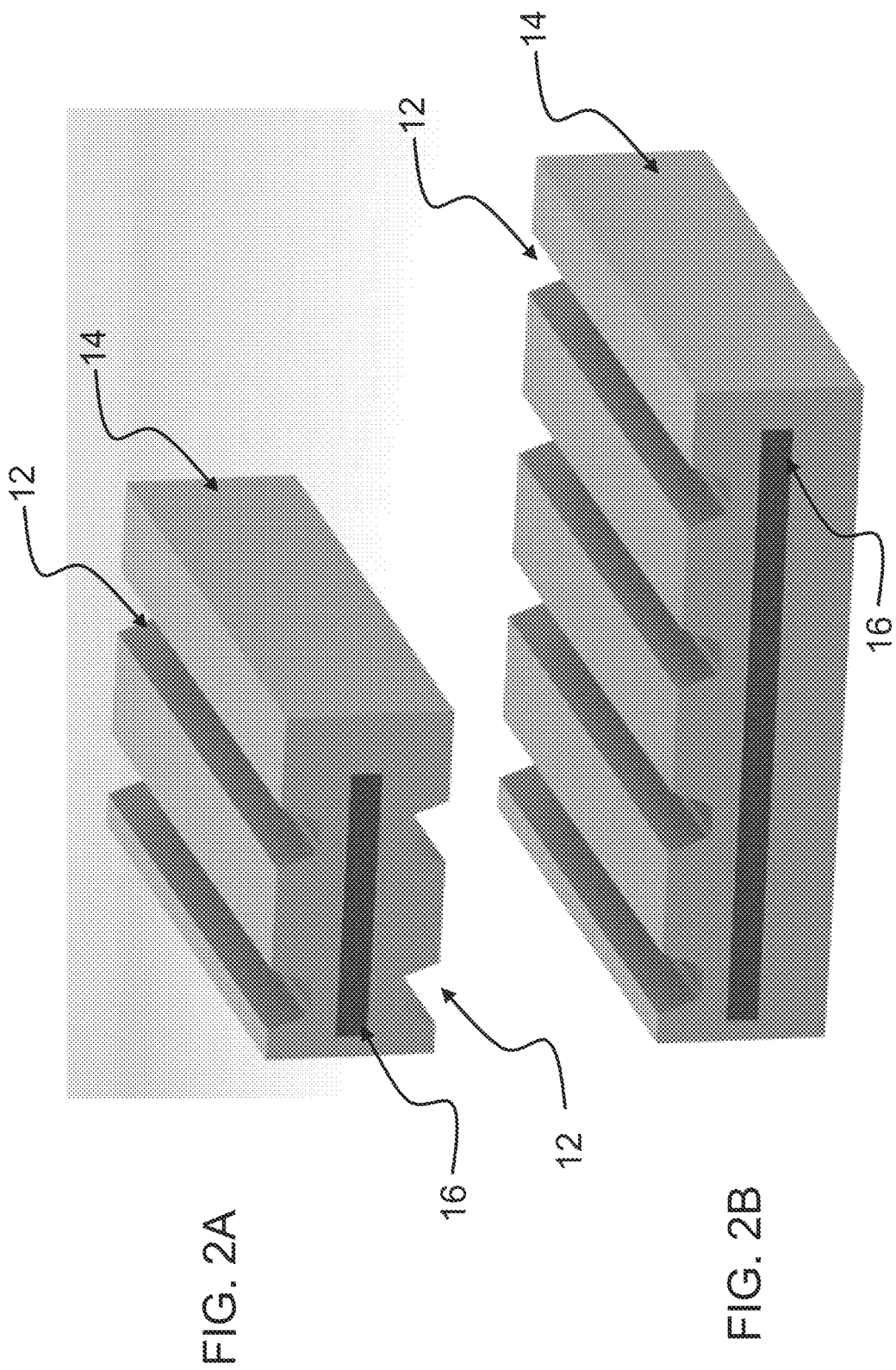
FIGS. 2A and 2B present perspective views of microchannel plasma devices with microchannels on opposing sides (FIG. 2A) and on a only one side (FIG. 2B)

FIGS. 2A and 2B show that the microchannel microplasma arrays can be formed on one (FIG. 2A) or both (FIG. 2B) sides of a planar electrode. Experimental microchannel plasma array modules and miniature reactors of the invention have been formed in a metal oxide dielectric 14 via powder blasting, with the resulting channels typically having a trapezoidal cross-section and the width of the channel at the aperture typically in the 50-900 µm range.

When the microchannels 12 are formed in the substantially defect-free metal oxide 14 via the powder blasting techniques described in Eden '197 US Published patent application (discussed in the background), the channel formation process can be controlled to produce a wide range of microchannel cross-section geometries, including ellipsoidal, trapezoidal, or semi-circular. Microchannels can also be formed in metal/metal oxide dielectric layers by micromachining, laser ablation, chemical etching and other techniques. See, e.g. Eden et al. U.S. Pat. No. 7,573,202. Polymer microchannels can also have various tapered, triangular, rectangular, and rounded cross-sections. See, e.g., Eden et al. U.S. Pat. No. 8,497,631.

Figure 3A:
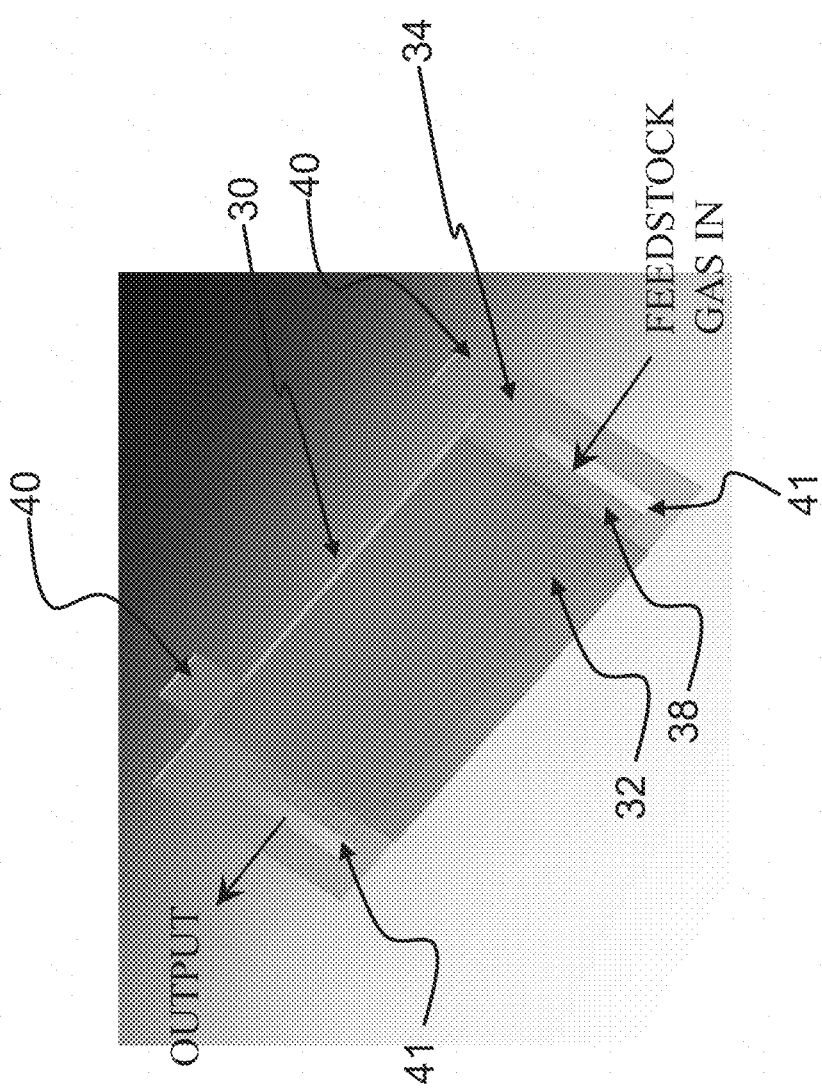
FIGS. 3A-3D are, respectively, perspective, transparent, partial magnified, and partial views of a preferred embodiment reactor module of the invention.

FIGS. 3A-3D illustrate a preferred embodiment microchannel plasma reactor of the invention that can be formed with the metal/metal oxide microchannel arrays of FIG. 2B. The reactors are configured as a thin wafer, which makes them highly modular. FIG. 3A shows a reactor 30 backside that is one wafer layer 32 and defines a first electrode layer. A second wafer layer of metal oxide 34 is joined to the wafer layer 32. The wafers 34 and 32 define alignment tabs 40 and wafer 34 carries microchannels 38 that are exposed at input and output ends to facilitate input of gas feedstock and output of product. The alignment tabs 40 can have exposed electrical contacts. In example module embodiments, exposed electrical contacts of the tabs 40 make contacts with clip, pin, spring or finger stock contacts when inserted into a module housing, which carries power through the housing to the electrical contacts. The wafer 36 is configured structurally with tabs 40 to permit easy assembly into the frame of a module. Gas ports 41 are rectangular slots, but can be other shapes, and provide access to the microchannels 38.

Figure 3B:
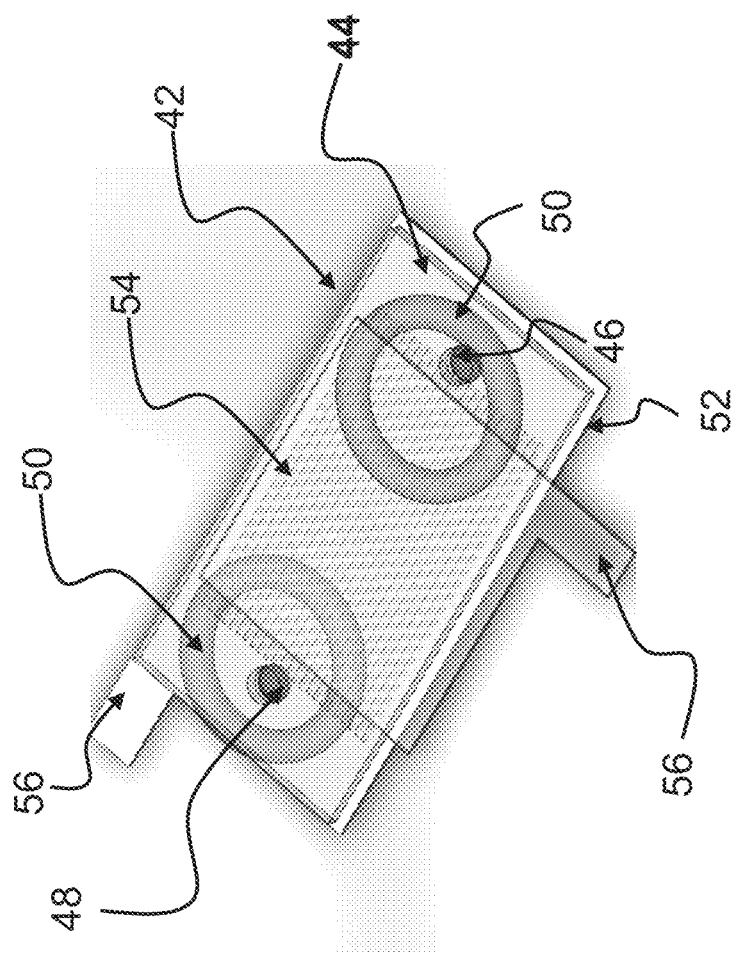

FIG. 3B shows the front side of a reactor 42, a microplasma array 44 with microchannels. Input and output ports 46 and 48 are circular in cross-section and are sealed by O-rings 50 and covers 52 and 54, each of which defines an alignment tab 56 that is an exposed electrical contact. One or both of the covers 52 and 54 can carry driving electrodes, which can alternatively or additionally be adjacent microchannels buried in metal oxide of the array 44.

Figures 3C, 3D:
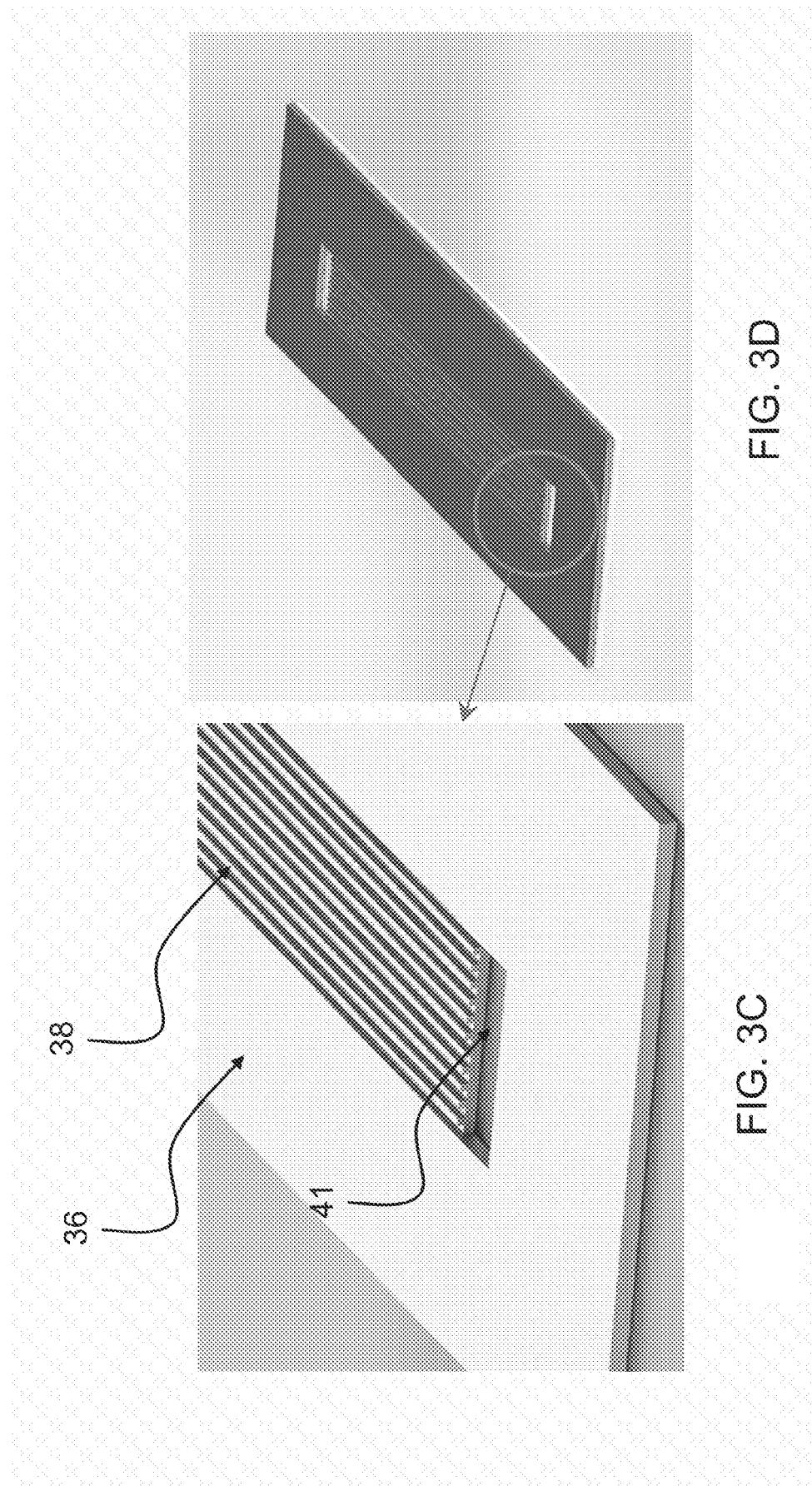

FIGS. 3C and 3D illustrate details of the wafer 34 of FIG. 3A. An array of the microchannel devices 38 is carried by the wafer 34 leaving the slots 41 to provide input and output gas ports. In preferred embodiments, each wafer is completed when joined to a next wafer, i.e. a second wafer may seal the microchannels of a first wafer and define input and output posts.

Figures 4A, 4B:
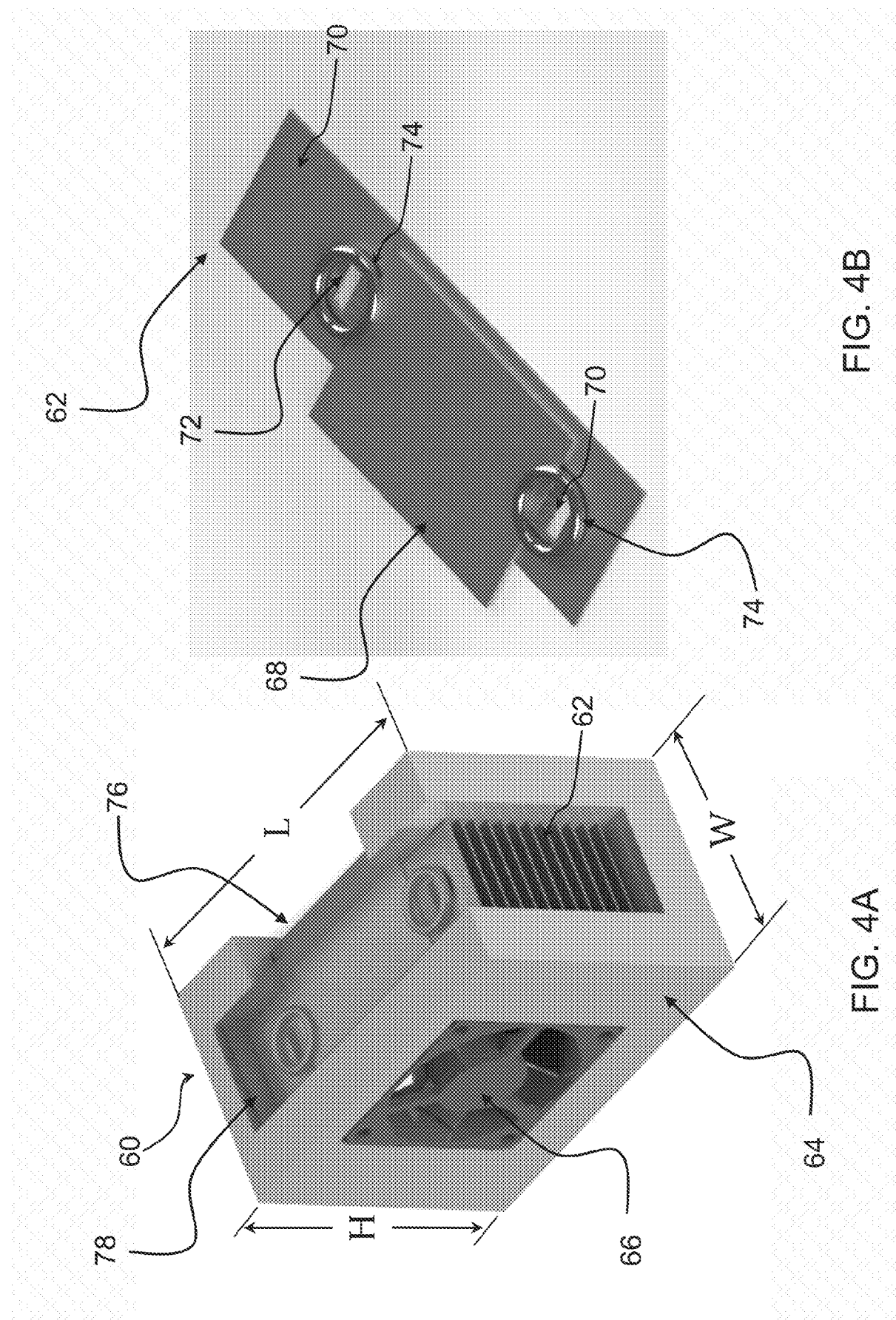
FIG. 4A is a perspective view of a preferred embodiment miniature reactor module with a plurality of individual microchannel plasma reactors held in a housing that also incorporates a fan.
FIG. 4B is a perspective view of an individual microchannel plasma reactor from the FIG. 4A preferred embodiment miniature reactor module.

The wafer or chip style reactors of FIGS. 3A-3D are configured to permit assembly of miniature reactor modules and systems while also providing the necessary electrical connections and gas flow channels to permit plasma processing of an input feedstock gas and the output of a gas product. FIG. 4A shows a reactor module 60 comprising a plurality of individual microchannel plasma reactor devices 62 held in a housing 64 that also incorporates a fan 66, and FIG. 4B illustrates a preferred individual reactor device 62 prior to installation in the housing of the reactor module 60. In FIG. 4B, the microchannels are covered by a top electrode 68, which is a metal foil encapsulated by a layer of nanoporous metal oxide in the manner illustrated in detail in FIG. 1. This top layer 68 also seals the microchannels below it. FIG. 4B also shows that the shape of the top electrode 68 can provide the registration (positioning) function that aligns feedstock input ports 70 and output (product) ports 72 of all of the individual arrays. Circular seals (such as O-rings) provide an airtight (vacuum) seal between all of the arrays when they are clamped together in the housing 64. The housing 64 defines a shape that accommodates the reactors 62. The fitting is snug. Internally, the housing 64 includes electrical contacts (pins, clips, spring, finger stock, etc.) to individual electrical contacts (such as at tabs) of the reactor devices 62. The reactor devices 62 are spaced slightly apart at their ends, away from the seals 74. A front opening 76 fits to size a portion of the top electrode 68 that extends beyond the bottom electrode 70. A top plate clamps the reactors 62 and provides downward pressure to maintain seals. The seals 74 and surrounding area can also be sealed.

The fan 66 situated in the housing 64 provides for the circulation of ambient air between the individual reactor devices 62 that are separated slightly by the seals 74. Stacking of the individual reactor devices 62 in the housing 64 allows each microchannel plasma array to be air-cooled and also allows for the introduction of feedstock gases at the same end of all of the microplasma arrays and for the outflow of the desired plasma reaction product from the opposite end of all the reactor devices 62. Exemplary modules are designed to accommodate from 4 to 10 reactor wafer devices, and representative values for the width (W), length (L), and height (W) of a four chip module are 2"×3"×3", respectively.

Arrays fabricated in experiments have channels that are 100-500 microns in width and 2-5 cm in length. However, channel widths below 5 microns and channel lengths of at least tens of cm can be fabricated. Also, arrays with hundreds or thousands of microchannel plasma devices can be produced in a single array.

Figure 6:
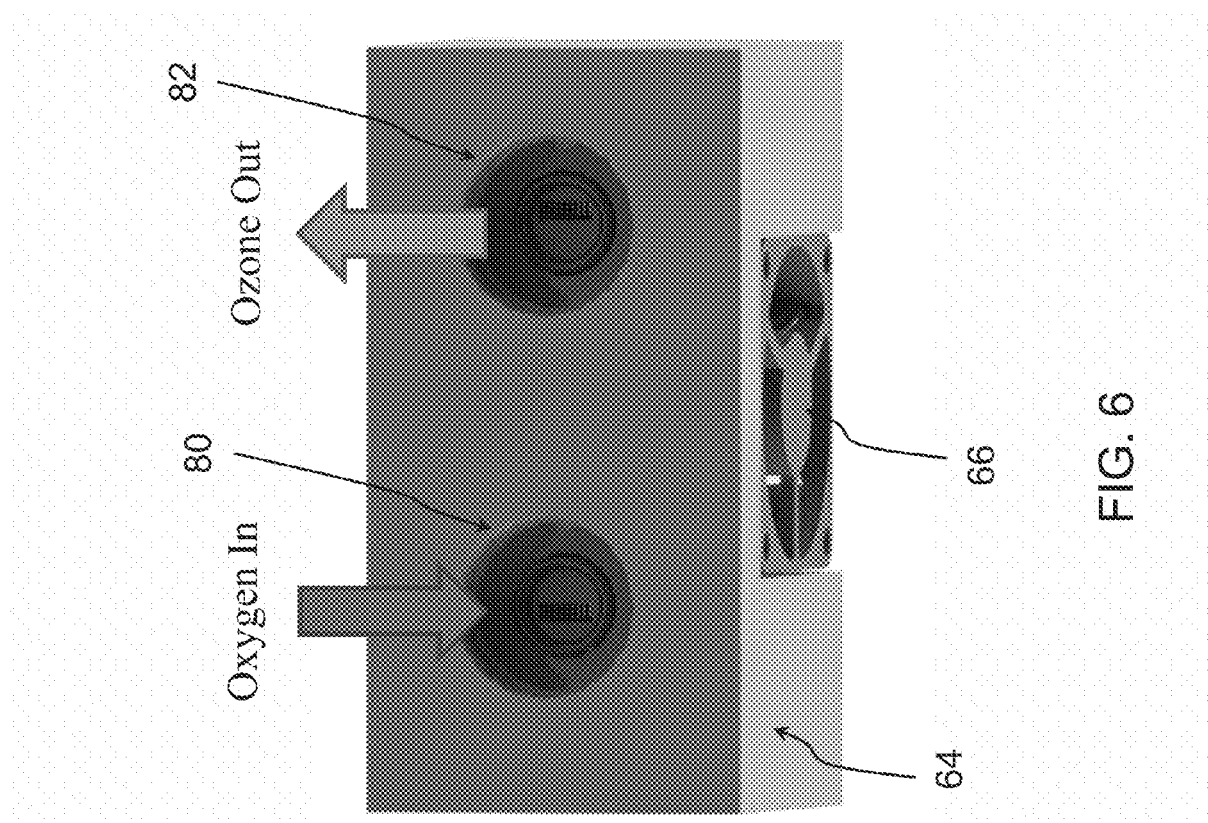
FIGS. 5 and 6 are perspective views of another preferred embodiment miniature reactor module.
Figure 5:
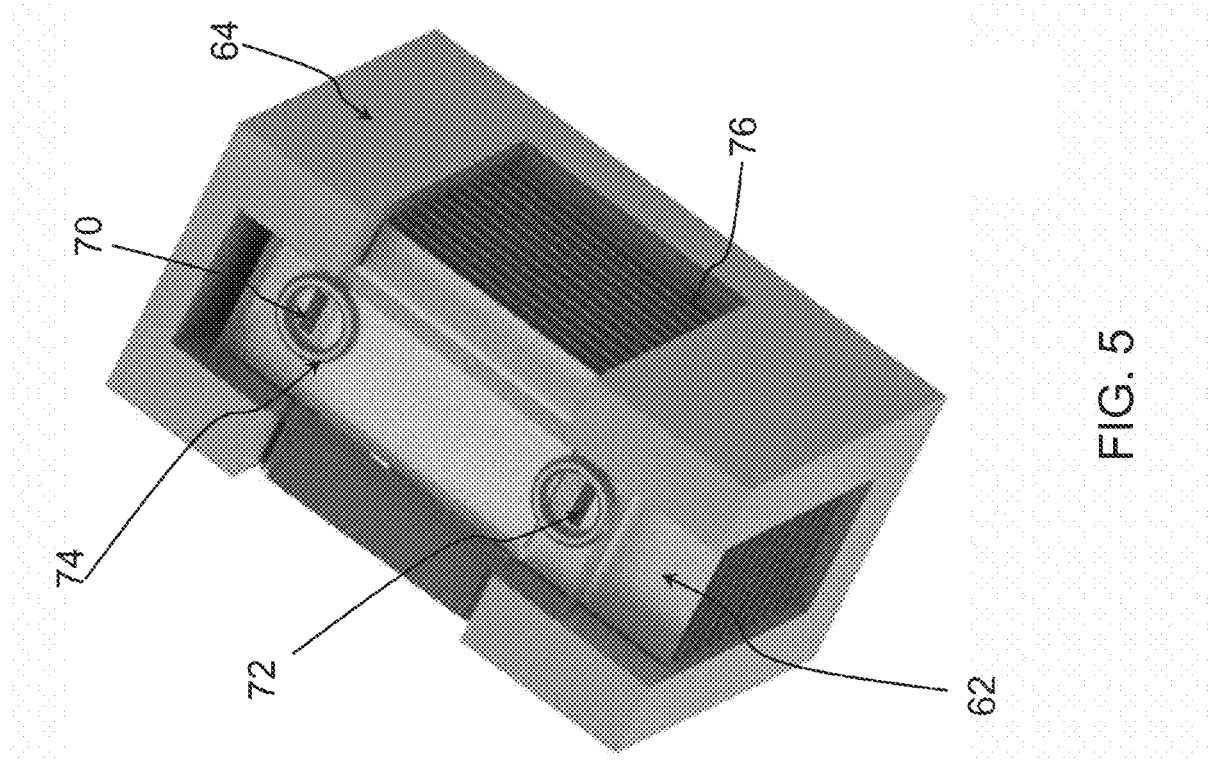

FIGS. 5 and 6 show additional views of a miniature reactor module in accordance with FIG. 4A. A top plate that seals a stack of reactor device wafers in the frame is omitted in FIG. 5 to illustrate a gas inlet 80 and outlet 82 formed in the housing 64 and to show that the housing 64 clamps the stack of modules together in such a way as to obtain a vacuum tight seal between each of the wafers and its neighbors. Such a miniature reactor module is a building block for larger reactor systems formed by pluralities of reactor modules.

FIG. 7 illustrates part of a preferred embodiment reactor system 88 that is formed by an array of modules 60. The system is shown as being partially assembled to show features that contribute to the gas flows and the arrangement of the modules 60. Modules 60 are configured to interlock with each other so as to assemble into the larger reactor system 88, which can be used to realize plasma-chemical reactor systems of virtually any size. Each microchannel plasma module 60 includes a groove 90 that is fabricated on its bottom and top faces. A base plate 92 also includes grooves 90 that serve to align modules 60. Gas ports 96 on the plate 92 and tops of the modules 60 are formed as male connectors. Bottoms of the modules 60 have a tongue to interact, and lock, with the grooves 90, and female connector gas ports (not shown) to mate with the gas ports 96. The base plate 92 also includes sets of input ports 98 and output ports 100. Electrode contacts 102 are also present on the tops of the modules 60 and interact with contacts on the bottom of a mating module 60. These features allow for interlocking the modules while maintaining a vacuum tight connection between them. All modules are mounted onto the base plate 92 into which flow channels are formed through the base plate 92 and reactors in the modules 60 for the incoming feedstock gas(es) and the outgoing plasma-chemical product (ozone, in this case).

Various flow patterns can be created, as shown in FIGS. 8A and 8B, in which feedstock gas is processed by fewer modules (two in the example provided by FIGS. 8A and 8B) before the gas flow stream enters an exit plenum 110 in which the gaseous products are collected. The arrangement of FIGS. 8A & 8B allows for readily determining and setting the optimal total length of plasma channel through which a given feedstock gas travels before leaving the reactor. If the total microchannel path through which a feedstock gas molecule passes is beyond the optimal value, then power is wasted and some fraction of the product molecules (i.e., the desired reactor output) may be destroyed chemically in the plasma or at the microchannel wall. A major benefit to the modular approach provided by the reactors of the invention is the ability to quickly configure reactors so as to provide a specific (optimal) processing length, permitting quick configuration of low cost but reliable reactors without requiring a new reactor design for higher levels of product output. Instead, individual array modules are readily configured into series or parallel arrangements to form larger reactors, thereby achieving a specific grams per hour output and/or a specific duration of treatment in a feedstock (input) gas. With conventional ozone generation technology, reactor design often changes fundamentally as the reactor size is scaled.

FIGS. 8A and 8B also illustrate another application of the invention in which feedstock gas is processed by one or more miniature reactor modules, after which the feedstock/product flow stream enters a region 112 in which a different feedstock gas, indicated as a "reactive gas" in FIG. 8A, is introduced for the purpose of reacting with the gaseous products generated within the first reactor modules. An example of a process for which such an arrangement is desirable is the plasma-conversion of carbon dioxide to an industrially-valuable commodity such as formic acid, methanol, or syngas. All three can be formed when $CO_2$ is dissociated (fragmented) in a plasma by adding a second feedstock gas, such as water vapor or hydrogen, to the gas flow stream. The embodiments of FIGS. 8A and 8B are useful for more complex reactions that benefit from an initial plasma processing of the feedstock gas, followed by reaction with another gas (or vapor) in a second phase of plasma processing.

Figure 9B:
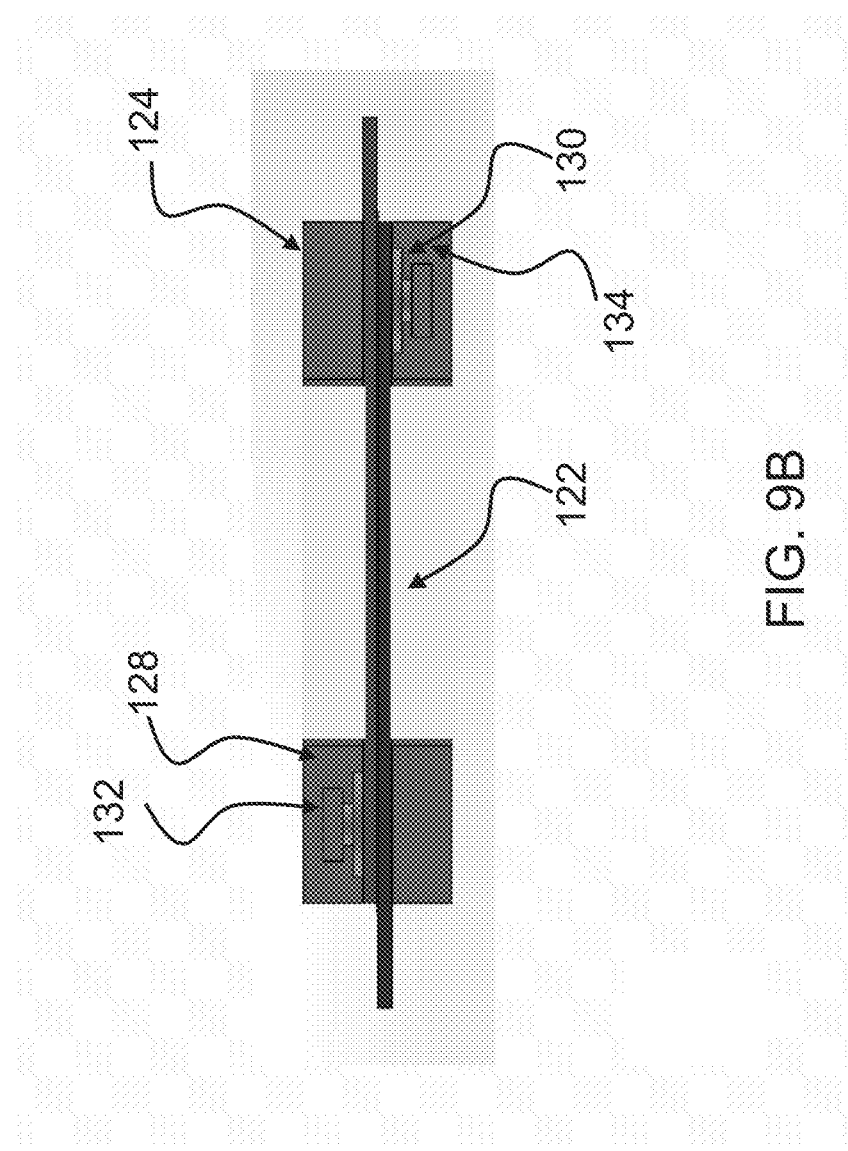

An alternative geometric arrangement reactor module 120 for operating microchannel plasma reactor chips 122 in tandem is shown in FIGS. 9A and 9B. In this embodiment, the individual microchannel array reactor chips/wafers 122 are mounted side-by-side onto a simple planar frame 124 into which O-rings 126, or other vacuum seal, are embedded. In this arrangement, feedstock gas flows along a narrow channel 128 that (as shown by the end-on view of the planar system in FIG. 9B) introduces feedstock gas into the same end of each microchannel plasma wafer. The output gas (ozone) is collected by a second channel 130 connected to the opposite end of all of the chips 122. The system includes an input 132 and output 134 port at ends of the channels 128 and 130. The reactor design of FIGS. 9A and 9B has a low profile form factor that is well-suited for applications in which a flat profile is advantageous. Manufacturing the module embodiment of FIGS. 9A and 9B is straightforward and may prove more economical than other embodiments.

Figure 10:
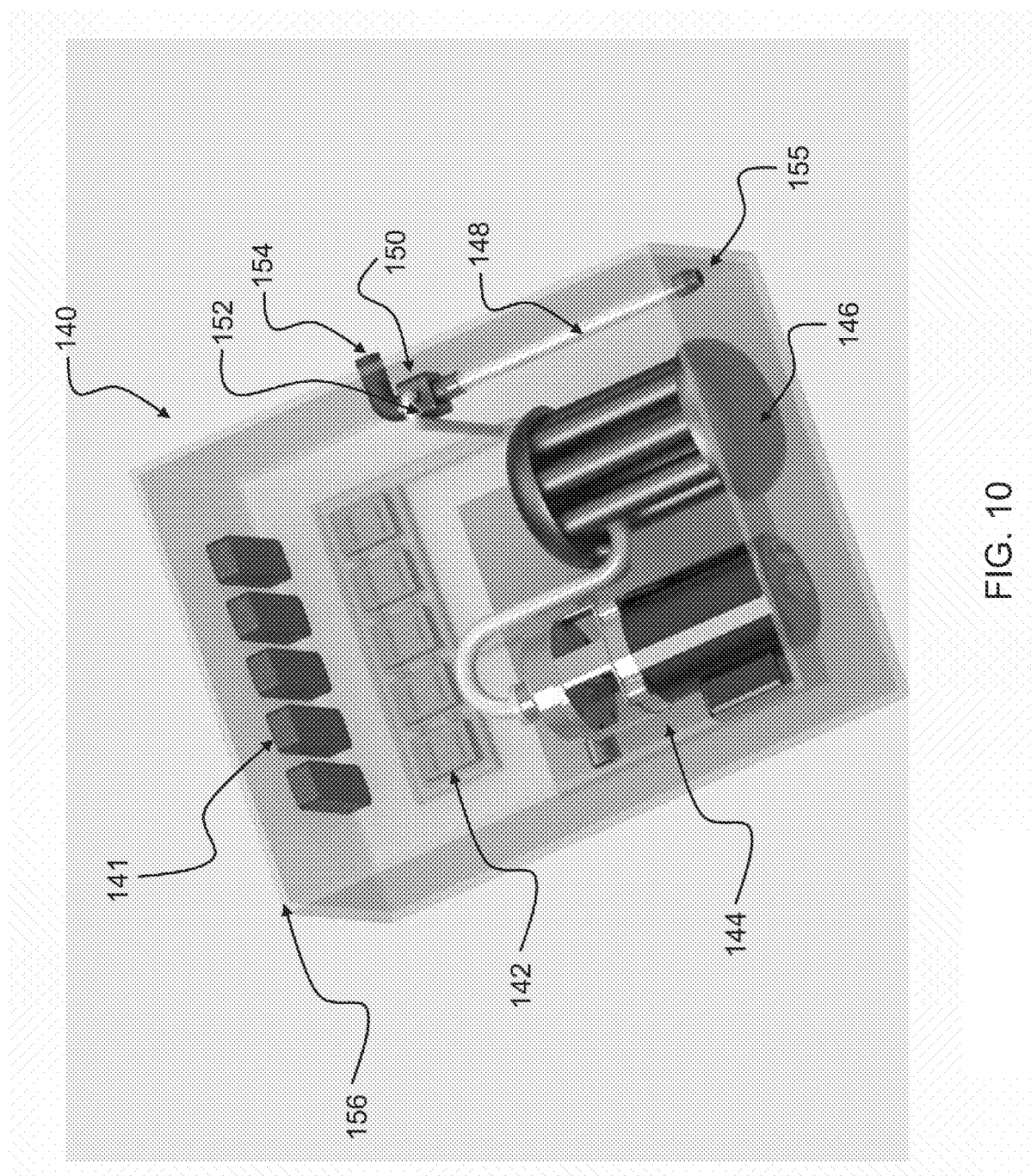
FIG. 10 is a perspective view of a preferred embodiment injection reactor system of the invention.

FIG. 10 shows an injection reactor system 140 of the invention designed for the injection of ozone into cold water for the purpose of water disinfection or cleaning laundry. The system includes five reactor systems, e.g., the FIG. 9A system as a large module 14, that are powered by pulse generators 141. Feedstock oxygen is generated by an air pump 144 and concentrator 146. Several concentrators are available commercially and all are compatible with the array modules of the invention. A water bubble mixer 148 contains water that mixes with ozone at a mixer 150, such as a bubbler or Venturi valve, with ozone received from an ozone input 152. The input 152 receives ozone from the module 142. Water input to the bubble mixer 148 is from a water inlet 154 and is output at a water outlet 155. The injection system 140 is contained in a housing 156, and can be configured to have normal residential or commercial plumbing connections at the water inlet 154 and water outlet 155. The system can be easily attached to household or commercial water supplies.

Figure 11:
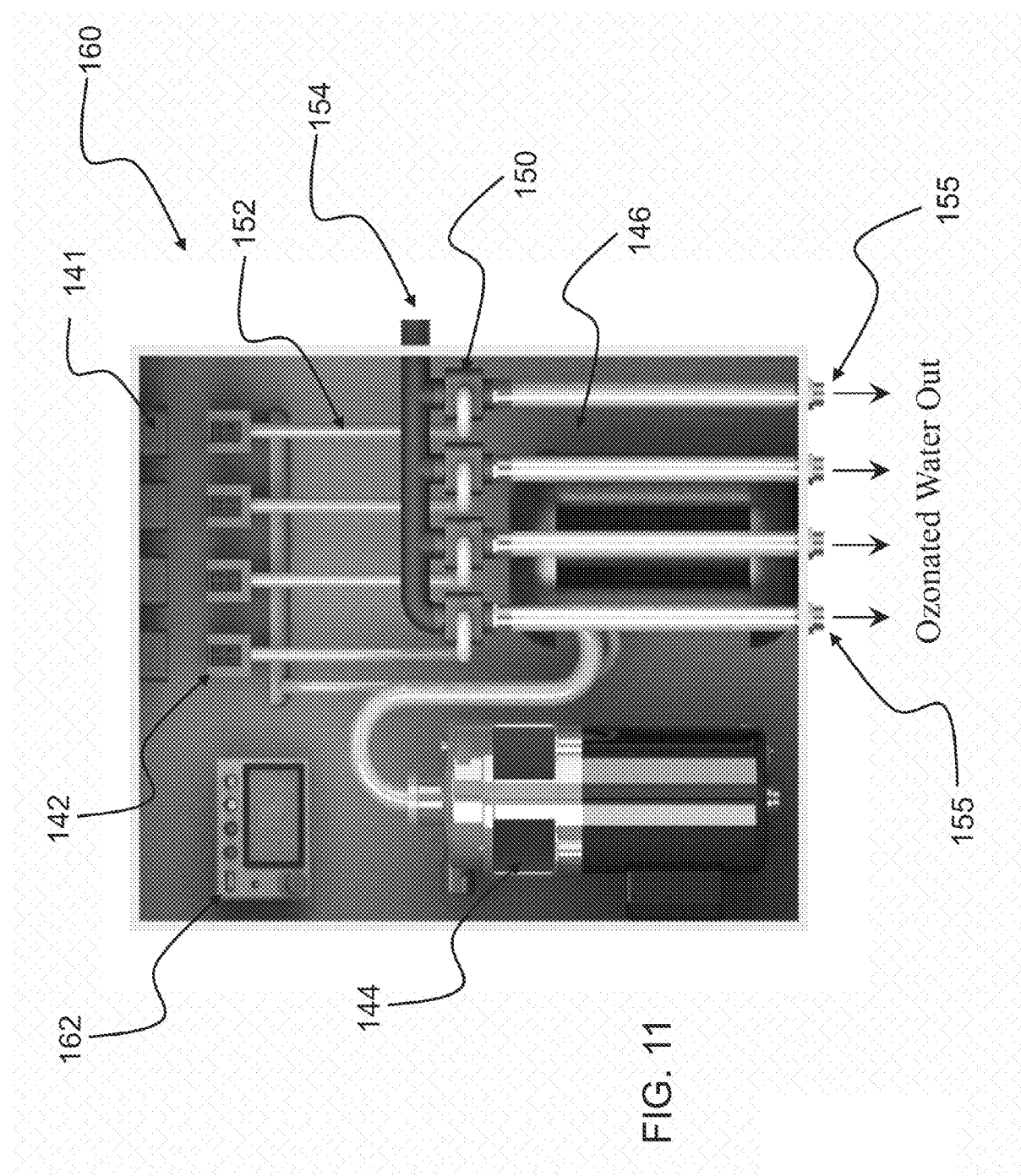
FIG. 11 is a perspective view of another preferred embodiment injection reactor system of the invention.

The system in FIG. 10 includes a single water inlet and outlet, and uses the reactor module of FIGS. 9A and 9B. FIG. 11 illustrates an alternate ozone generator 160. A primary difference is multiple water outlets 155. Another difference is that a reactor module 142 is provided for each of a plurality of ozone inputs 152, corresponding to the number of water outlets. The reactor modules are from FIG. 4A. Other features use reference numbers from corresponding parts in FIG. 10. A controller 162 can activate, deactivate and monitor the various components. The reactors of FIG. 11 employ multiple point injection of ozone. In FIG. 10-11, 4 or 5 miniature reactor modules 142 are each fed with oxygen produced from ambient air by the oxygen concentrator 146. In the reactor design of FIG. 10, ozone produced by 5 modules 142 is collected and injected into a water stream with the bubbler 150. Injectors are well known in the art and separate injectors can be dedicated to each microplasma reactor module, if desired. In FIG. 11, the incoming water stream is divided into four lines, each of which is treated with the ozone produced by one (or more) dedicated reactor modules 142.

Figure 12:
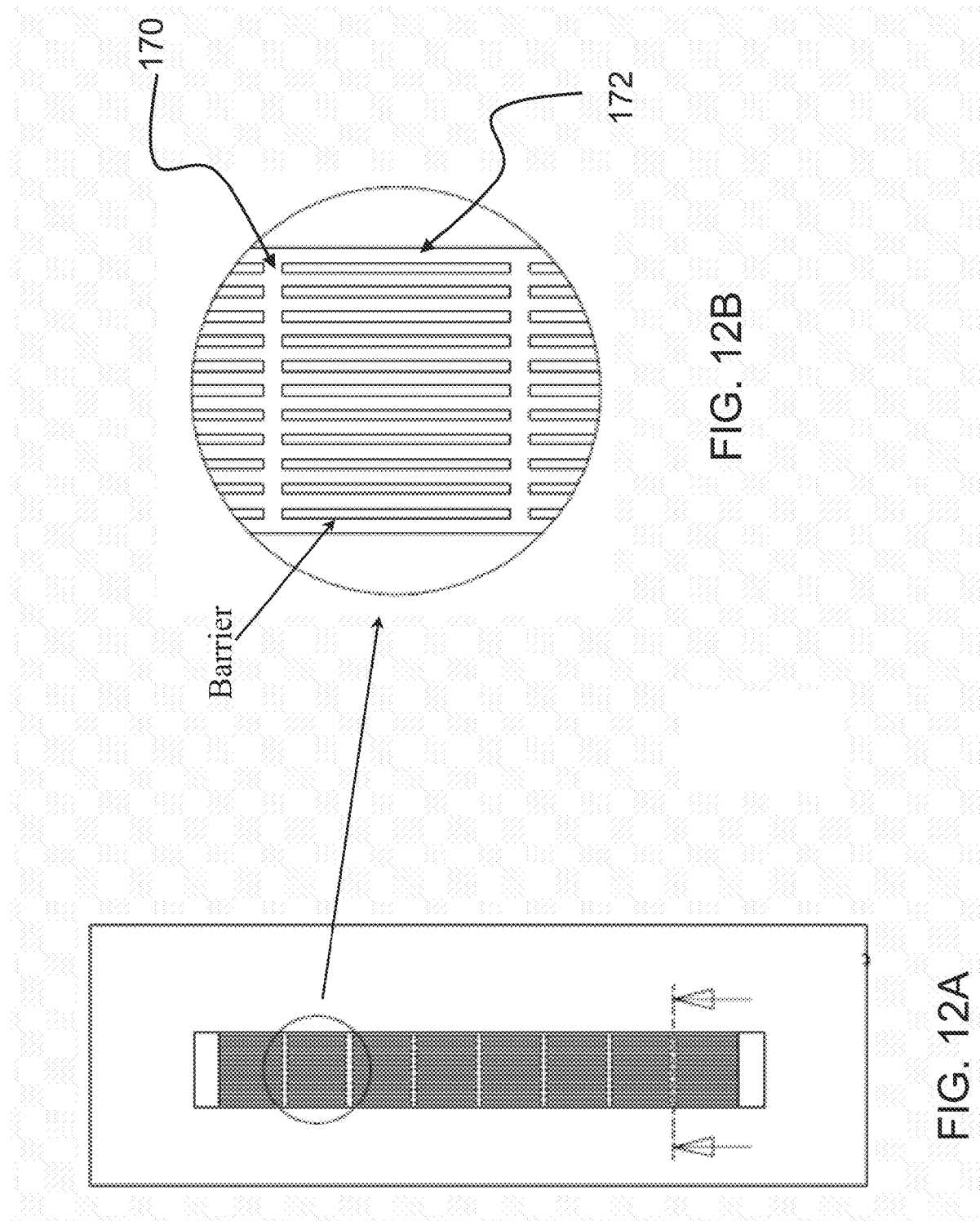
FIGS. 12A and 12B are schematic views of a preferred embodiment ladder microchannel reactor module of the invention.
Figure 13:
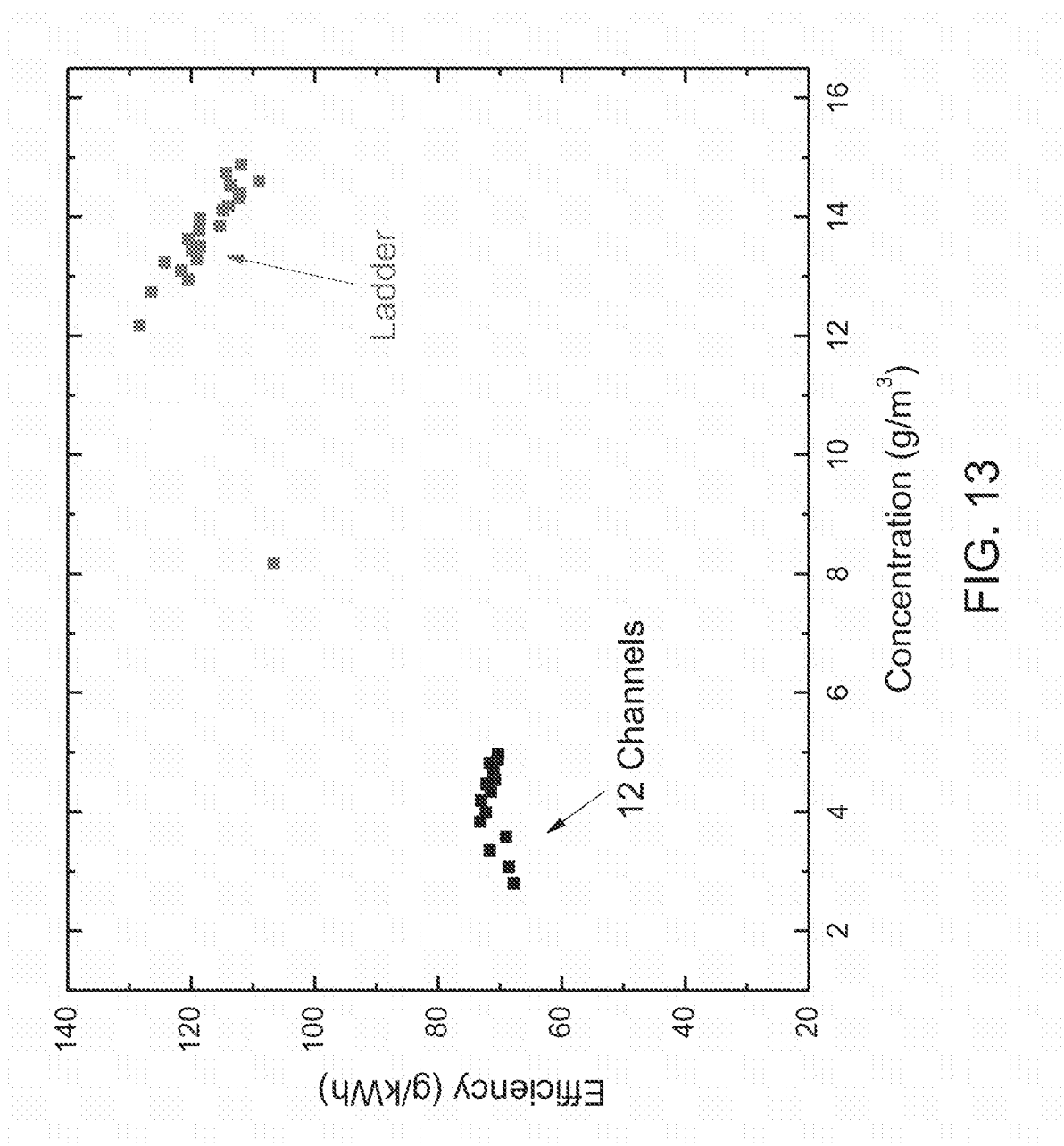
FIG. 13 shows data concerning an experimental ladder reactor of the invention in accordance with FIGS. 12A and 12B.

FIGS. 12A and 12B illustrate a "ladder" microchannel reactor design that has been found to produce ozone more efficiently than simple parallel microchannels. In the design of FIGS. 12A and 12B, cross channels 170 periodically interrupt main microchannels 172. The intersection between the primary 172 and cross microchannels 170 need not occur at a right angle and the dimensions of the two channels can differ. This ladder structure microchannel array, operating in pure oxygen at a pressure of 760 Torr, has been tested extensively. The data in FIG. 13 show that the ladder microchannel reactor module of FIGS. 12A and 12B produces ozone from oxygen with an efficiency (expressed in grams per kilowatt-hour, g/kWh) that is more than 50% higher than the value measured when the cross-channels are not present. Gas flow simulations suggest that the reason for this unexpectedly higher efficiency is the result of an increased residence time for a feedstock gas molecule in the microchannel array, owing to the cross-channels.

Ozone distribution systems are also provided by the invention. Preferred distribution systems are particularly useful in commercial applications of ozone that require low production rates of the molecule. Weight and volume are invariably priorities, and lightweight distribution systems of the invention are very well suited for applications in food storage and the deodorization and decontamination of air. A fan 180 of a miniature reactor module (as illustrated in FIGS. 14A and 14B) draws room air into the ozone reactor 182. On the side of the unit array opposite to where the fan is located, a flat ozone disperser or sprayer is attached to (or embedded within) the unit array.

Figure 15:
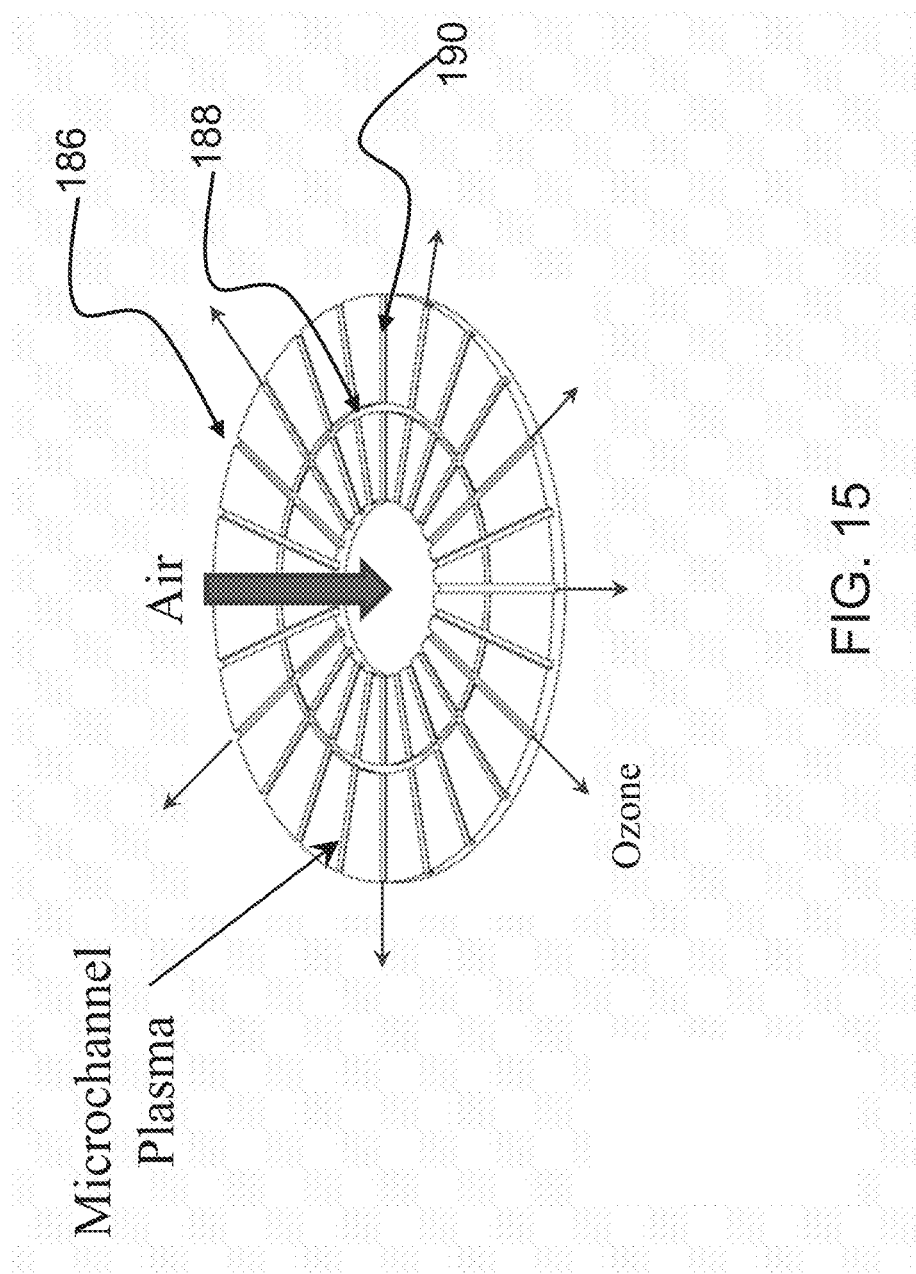
FIGS. 15 and 16 are perspective views of ozone distribution sprayer plates for preferred embodiment reactor modules of the invention.
Figure 16:
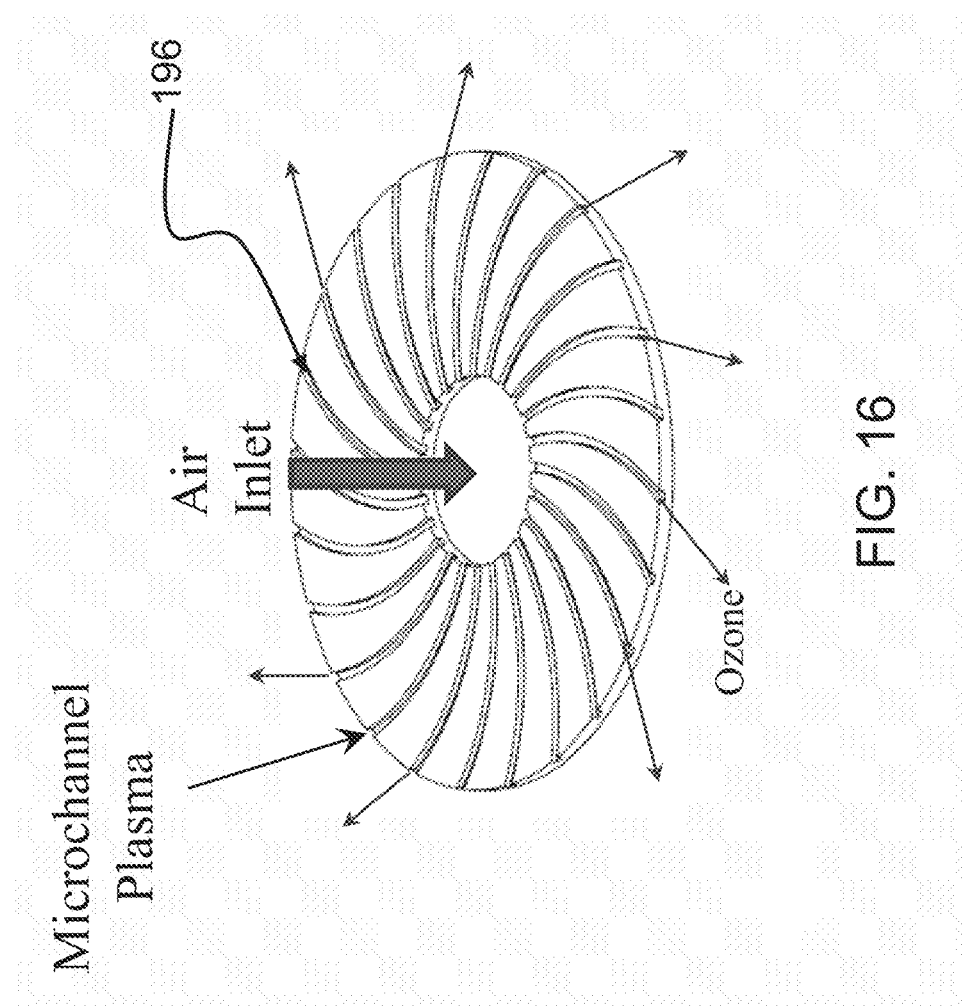
Figure 17:
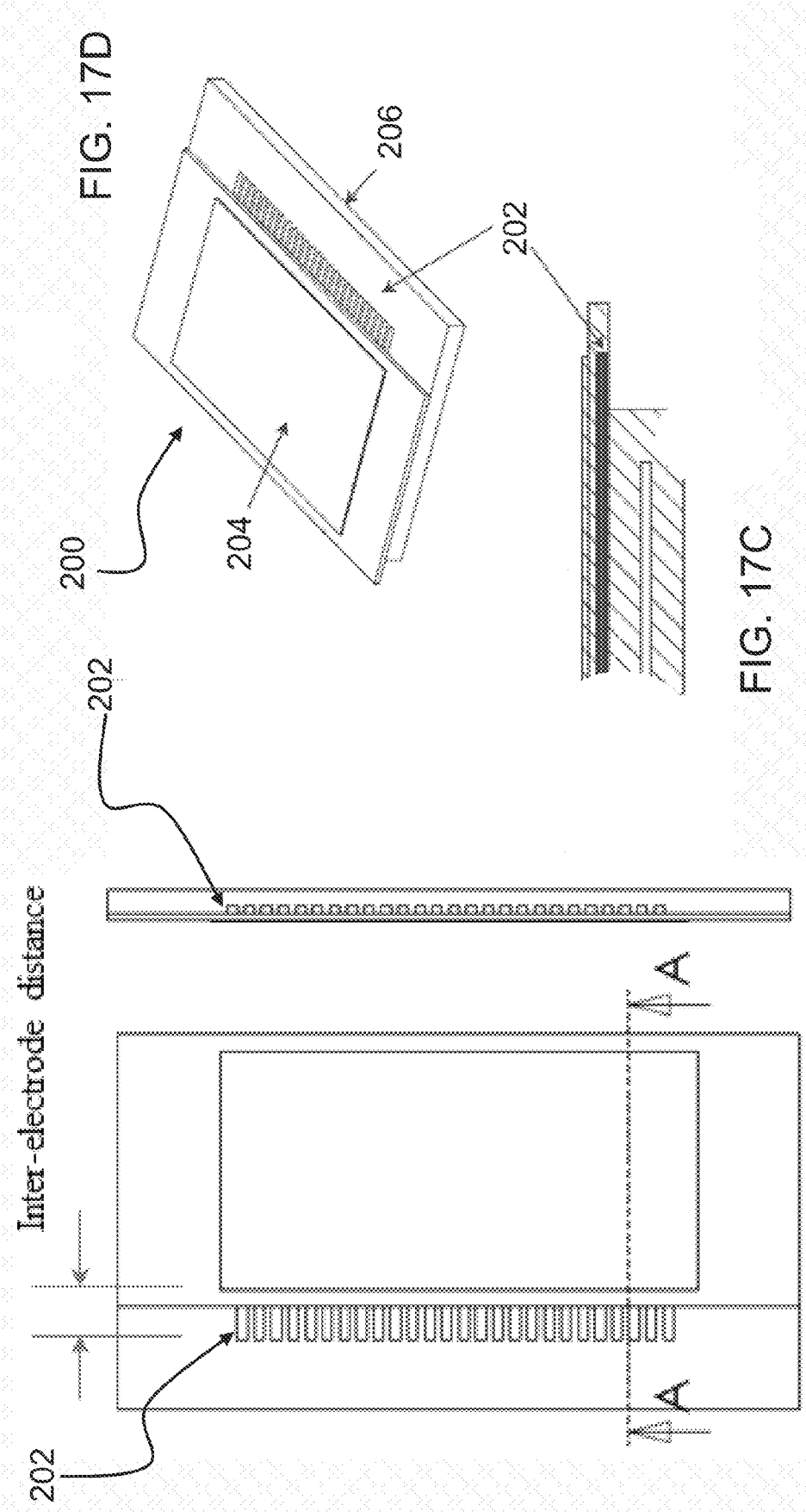
FIGS. 17A-17D are views of a preferred embodiment microchannel microplasma array reactor module with plasma actuation.

FIGS. 14A (exploded) and 14B (assembled) show the miniature ozone generator that includes an air guiding funnel 184 to direct output of a reactor module to a sprayer 186. The sprayer 186 disperses ozone (emerging from the reactor module 182) away from the outlet of the reactor module 182 in an omnidirectional pattern. Depending on the specific application, it may be desirable to make the ozone dispersal pattern more directional. For most applications, an azimuthally uniform dispersal pattern is best. Example thickness t of experimental generator units built is less than 2 cm. Two embodiments of the ozone sprayer plate are illustrated in FIGS. 15 and 16. The first (FIG. 15) has a radial geometry 186 with one or more circular microchannels 188 that will ameliorate any flow rate differences that might exist between the radially-oriented channels 190. A spiral or pinwheel design with curved microchannels 196 for the sprayer plate is shown in FIG. 16.

The microchannels in the sprayer plate can be formed in like manner to the microchannels in the microchannel plasma array wafers. For example, channels are micromachined into alumina or other material by micropowder ablation and typical channel depths and widths are 30-250 µm and 200-800 µm, respectively. As was the case with the linear channel arrays of FIGS. 1-4, low temperature plasma is produced within the channels. The microplasmas convert a fraction of the O2 in the feedstock gas into ozone.

Figure 14:
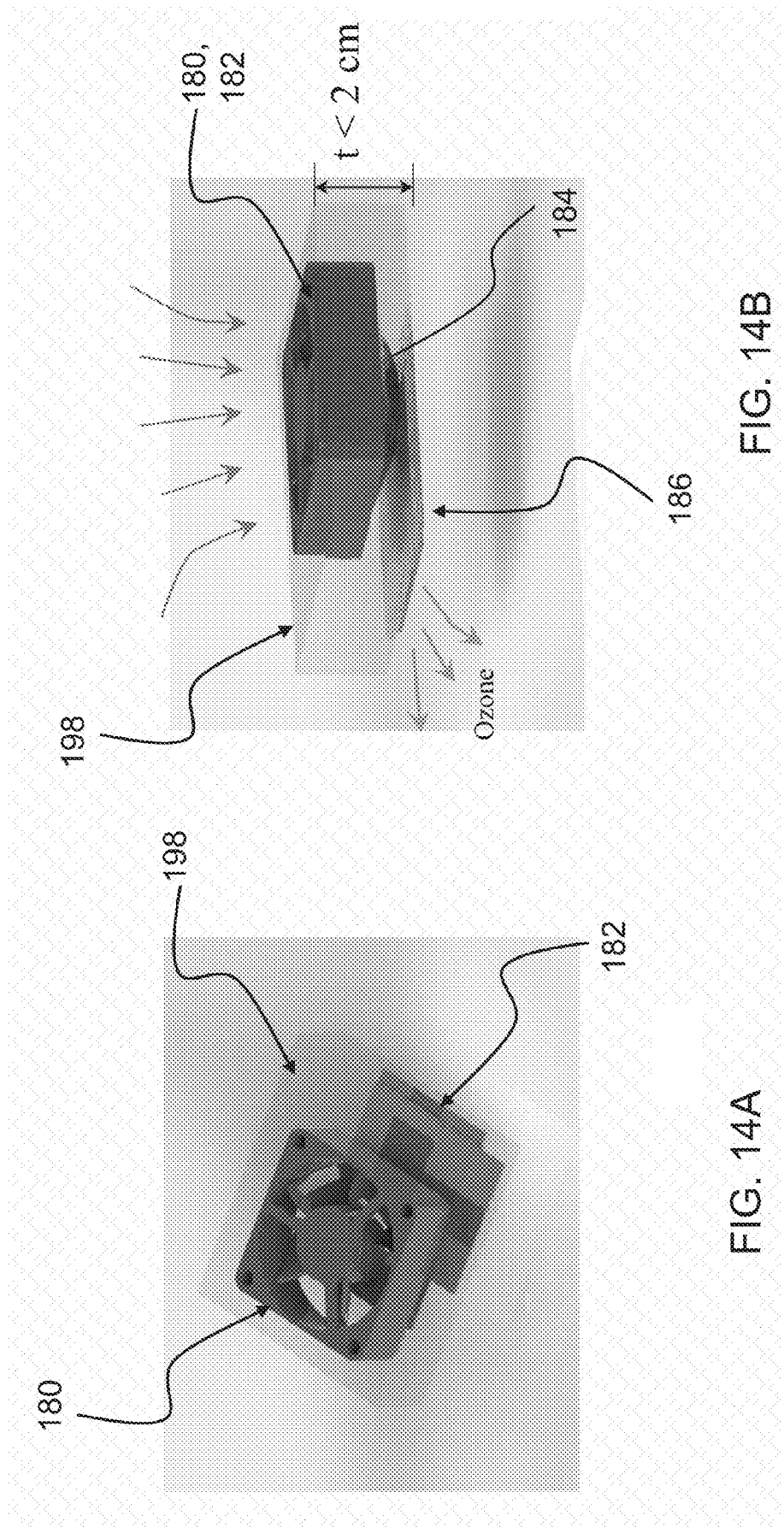
FIGS. 14A and 14B are perspective views of a preferred embodiment miniature reactor module that includes an air guiding funnel to direct output of the reactor module to a sprayer.

As shown by the diagrams of FIGS. 14A and 14B, the entire miniature ozone reactor module includes and is held within a flexible plastic block 198 that has been molded to fit snugly to maintain seals between individual reactor array devices in the module. In an example module, the thickness of the plastic structure is less than 2 cm and the finished generator assembly is lightweight. A series of food preservation tests have been completed that demonstrate the efficacy of the system of FIGS. 14A and 14B in extending "shelf life." For example, bread (of various types) is rendered completely unfit for human consumption when stored at room temperature for more than a few days. However, when one of the miniature reactor module units of FIG. 14 is located with the bread in a container at room temperature and the generator is turned on for only 2 minutes each day, then the bread remains in pristine condition after two weeks of storage. Power was supplied by 9 or 12V batteries with a DC to AC inverter and transformer, requiring only 1 to 2 Watts of power. Other studies being conducted show that the useful lifetime of high value food products such as mackerel and "black pork" (popular in Asia) is extended to one week by miniature reactors of the invention. Black pork normally spoils rapidly at room temperature. The cost of cooling this difficult to maintain product throughout shipping and distribution is prohibitive, but shipping this and other food products at room temperature in sealed plastic bags incorporating ozone generators of the invention offers the opportunity to dramatically lower shipping costs.

The only electro-mechanical component in the above discussed miniature reactor modules is the fan. In additional embodiments, the fan is replaced with a microplasma actuator that generates the necessary flow. FIGS. 17A-17D show a microchannel microplasma array reactor 200 with plasma actuation that creates a slight gas flow through the microchannels 202. Large scale plasma actuators have been used in the past, but the microplasma actuator shown in FIGS. 17A-17B uses comparatively low voltage microchannel plasmas to draw air through the array without the need for any moving parts. The principle of operation of the actuator begins with the spatial offset (inter-electrode distance) between top 204 and bottom 206 electrodes. When plasmas are ignited in the microchannels. a pressure gradient is produced in the region where the microchannel array overhangs the top electrode 204. This produces the desired result of drawing air through the array. Although the gas velocity that is produced by the actuator of FIG. 17A-17D is not at the level of that produced by the fan, laboratory tests have shown that the plasma actuator does serve well as a replacement for the fan in the miniature ozone reactor. Aside from the elimination of moving parts. an additional advantage of the actuator is that it is readily integrated with the microchannel plasma array. Furthermore, a module with a plasma actuator is lighter and thinner than the fan.

Figure 18:
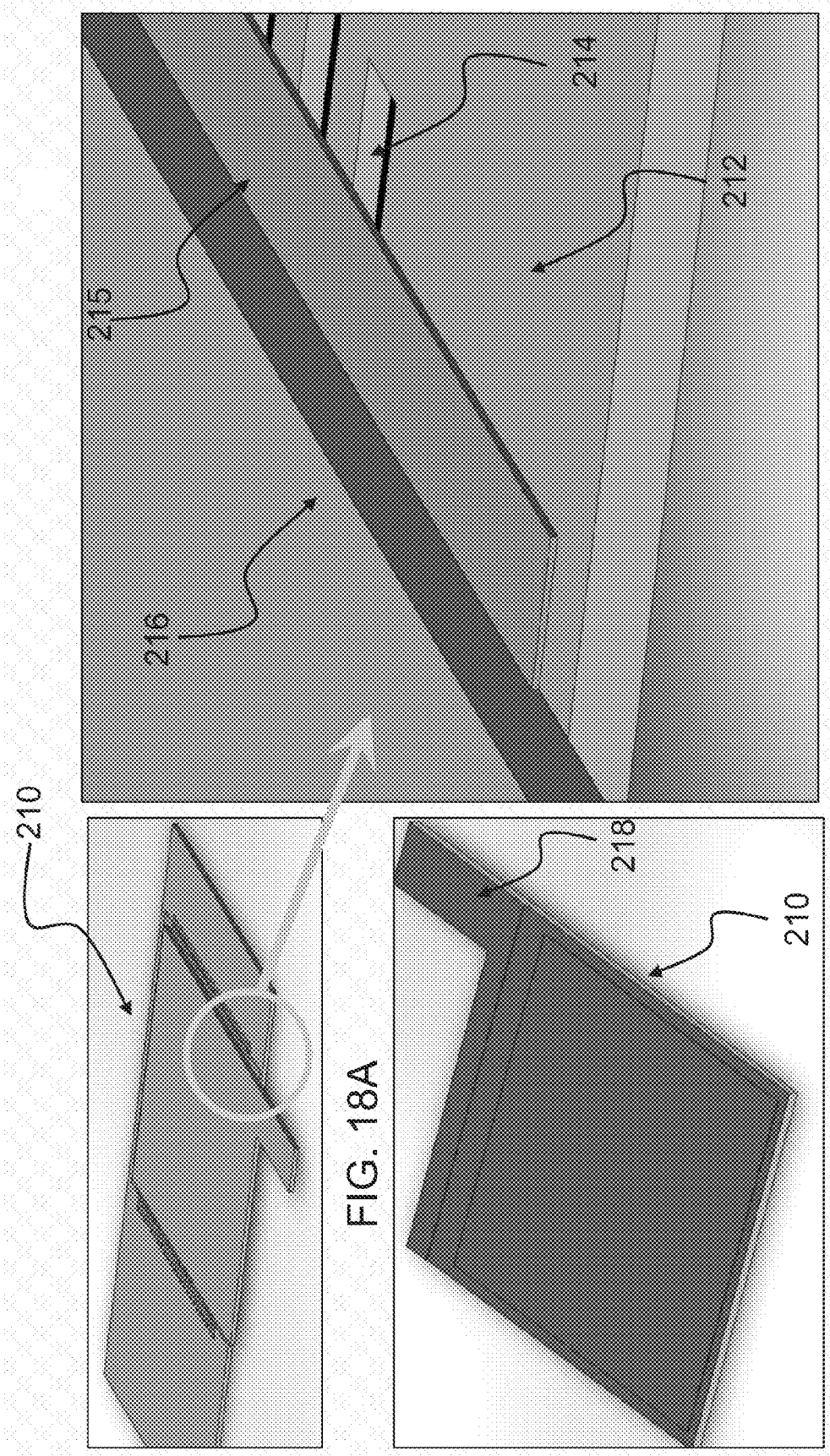
FIGS. 18A-18C are perspective views of a preferred embodiment prototype microchannel microplasma reactor of the invention.

FIGS. 18A-18C show an additional embodiment reactor 210 for which a prototype has been produced. The embodiment will be described along with features of the prototype. Artisans will appreciate that the embodiment is not limited to details of the prototype, but that prototype details provide a preferred example embodiment.

An encapsulated metal electrode 212 is realized in the prototype with a bottom $Al/Al_2O_3$ plate. The prototype was fabricated from 500 µm thick Al foil. After growing the aluminum oxide, the thickness of the plate is about ~600 µm. Channels 214 are formed in this plate via micromachining processes. Typical channels are between ~200 µm and 800 µm wide and ~30 µm-250 µm in depth. The channels are preferably coated with a dielectric. An example dielectric is a thin layer, e.g. 25 µm, of Silicone. A top encapsulated $Al/Al_2O_3$ plate electrode 210 is on top of the dielectric 215 of the bottom plate. In the prototype, the top plate was essentially square (4 cm×4 cm) but a small tab 218 was included that serves as an alignment aid when forming a stack of microchannel arrays to form a reactor modules. In a prototype, a top plate was formed from 250 µm thick Al foil, having a thickness of 300 µm (+/−15 µm). The top plate leaves a gap to expose the ends of the microchannels. In the prototype, ~5 mm of microchannel is exposed at each end, which allows gas to enter and exit the microchannels in communication with other arrays in a module. Typical microchannels are ~5 cm long, and typical bottom plate dimensions are ~7 cm long and ~4 cm wide.

Figure 19:
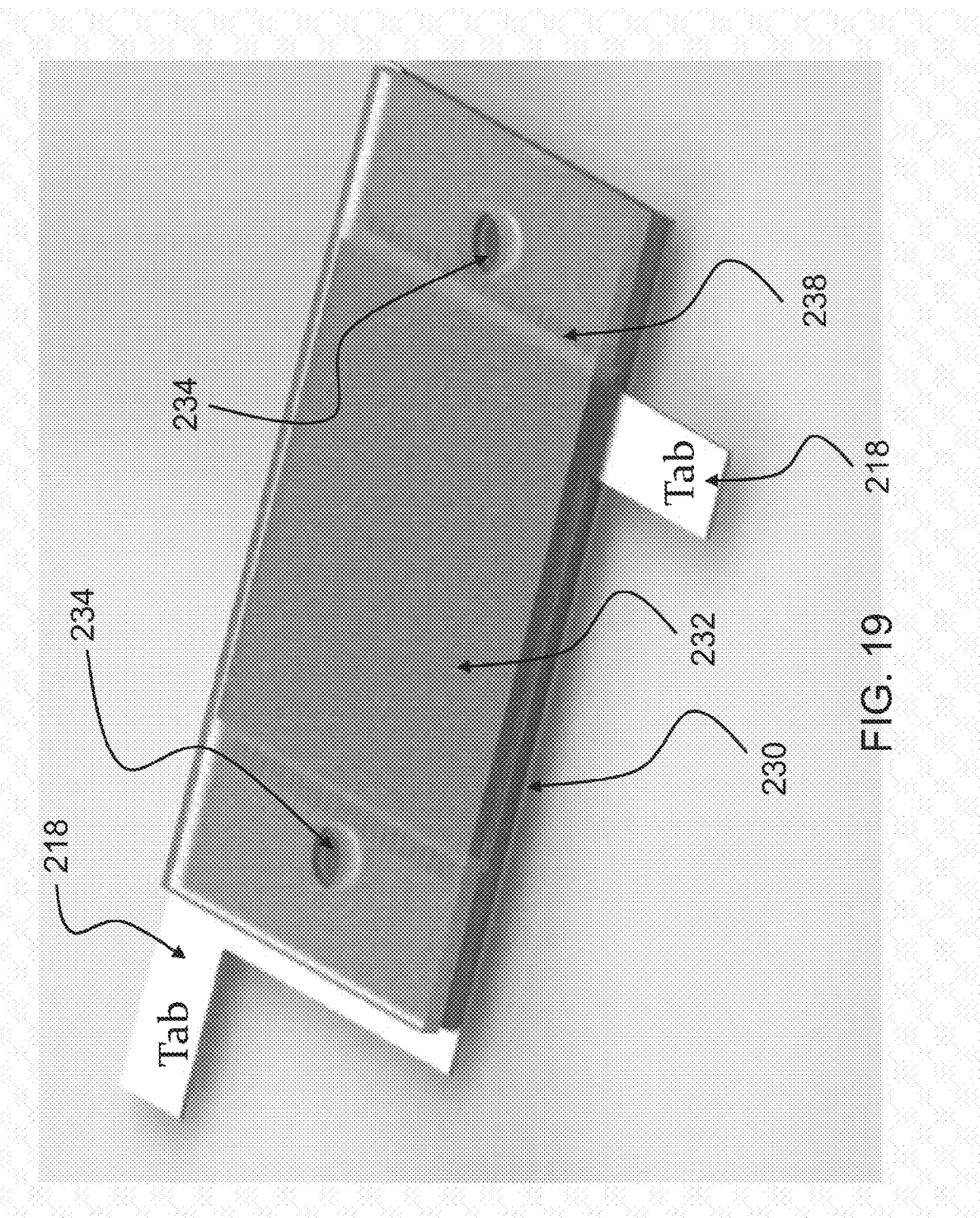
FIG. 19 is a partially transparent view of preferred embodiment sealed microchannel array reactor of the invention.

FIG. 19 illustrates a sealed microchannel array reactor wafer 230 of the invention. The reactor wafer is similar to FIG. 3B, but is individually sealed. A ceramic plate 230 completes a microchannel plasma wafer. A sealant, e.g., glass frit or vacuum grade, high temperature epoxy, seals the entire unit. The plate includes two holes 234 that will align with the exposed ends of the microchannels 236 to permit gas flow. One hole will serve as an inlet and the other as an outlet, and the module is configured to receive feedstock gas flow and output the desired plasma-chemical product.

Figure 20:
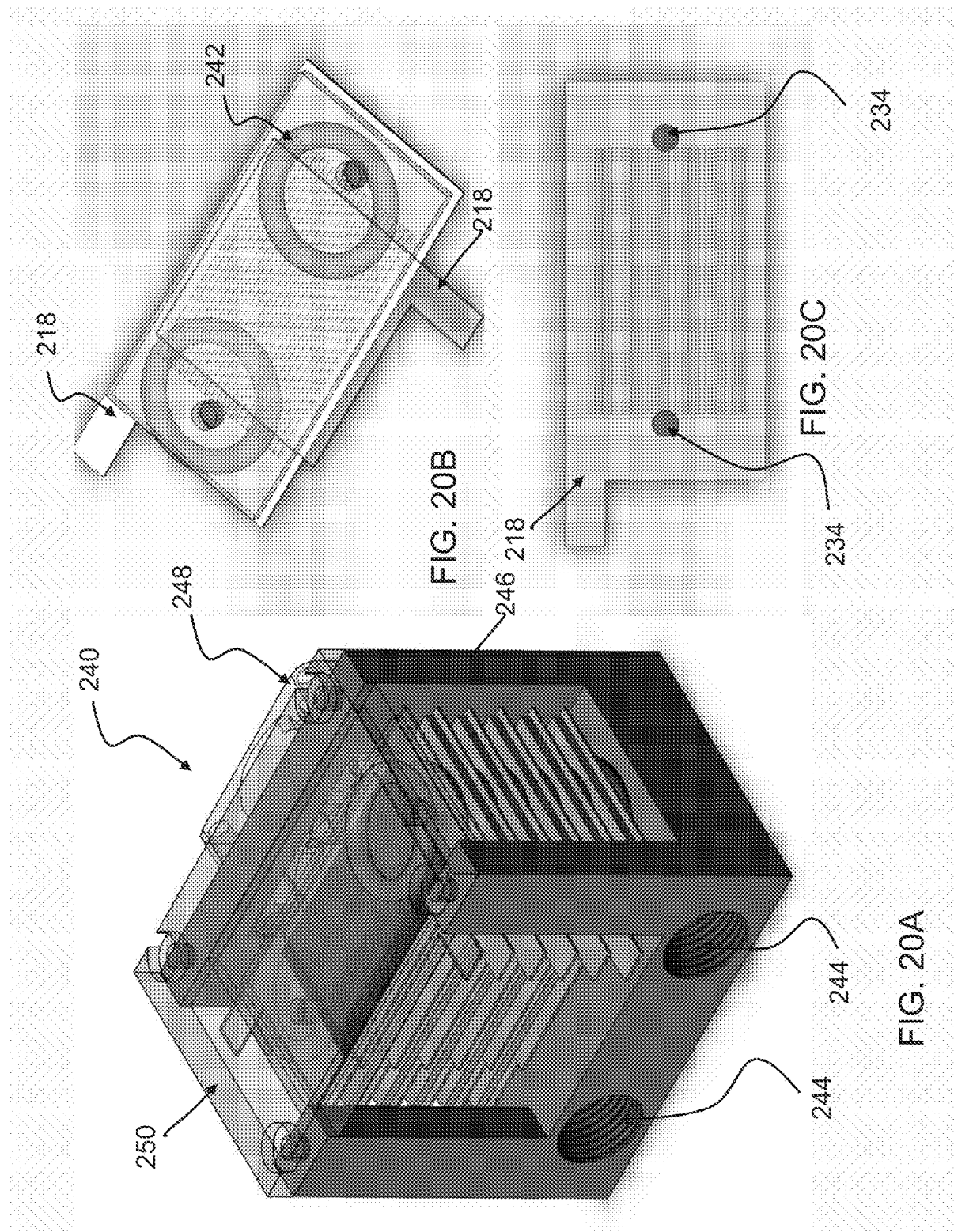
FIGS. 20A-20C are partially transparent views of a preferred embodiment reactor module (FIG. 20A) and reactors (FIGS. 20B & 20C) of the invention.

FIGS. 20A-20C illustrate another reactor module 240 formed from reactor wafers of FIG. 19. The reactor module 240 of FIG. 20A includes six wafer reactors. A number of these modules have been fabricated, and tested extensively. The location of the positioning tabs 218 and the vacuums seals (O-rings 242 in this instance) between adjacent microplasma channel reactor wafers can be seen. Threaded ports 244 at lower left are for the feedstock gas input and the exit for the ozone generated in the module 240. A diagram of a completed microchannel reactor wafer is given in FIG. 20B where the input and output gas ports are circular. A one tab version of the wafer is shown in FIG. 20C. The input and output gas ports 234 (circular, rectangular, etc.) provide access to (or from) all of the microchannels in the reactor device wafers of the module, as illustrated in FIG. 20C. A module housing 246 is open on 3 sides and holds a fan 248. A top cover 250 places downward pressure on reactors to create alignment and seals.

Figure 21:
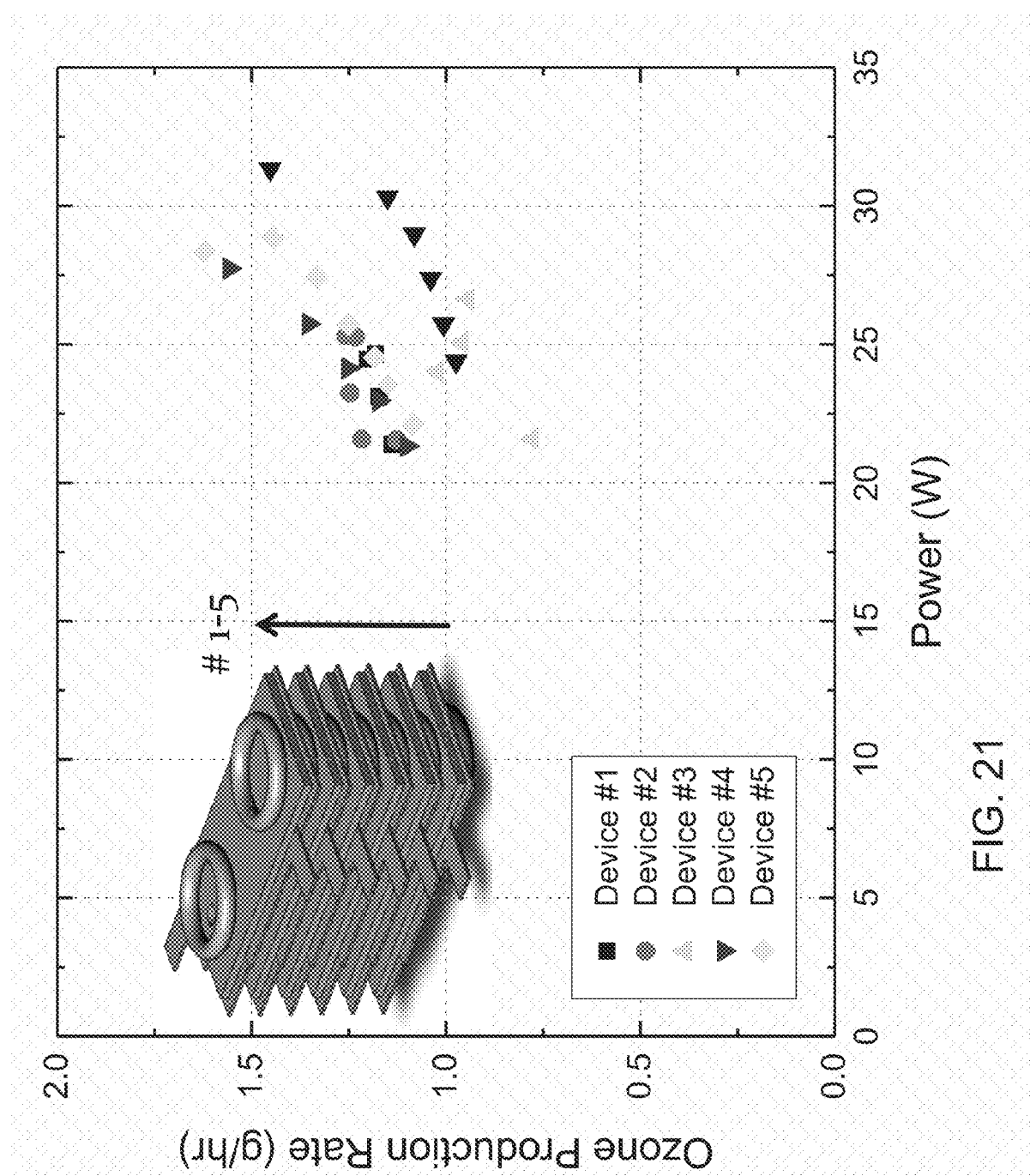
FIG. 21 provides test data from an experimental reactor in accordance with FIGS. 20A-20C.

Testing data are shown in FIG. 21. FIG. 21 shows testing data for a 5 wafer module. Each experimental wafer was assigned a number (e.g., EP163). Each wafer was tested separately, and then tested in a 5 module reactor configuration that was consistent with FIG. 20A. In FIG. 21, the individual modules (#1-5) were found to produce 1.2-1.6 g of ozone per hour. The 5 module reactor produced ozone at a rate of 5.5-7 g/hr. The applied voltage during testing was 725~770VRMS (2.8~3.06 kVpp), and the waveform was a 20 kHz sinusoid. For these tests, the feedstock gas was oxygen at a pressure and flow rate of ~5 psi and 4 liters per minute respectively.

Testing also showed that the optimal channel width for ozone production in this embodiment is between 200 μm and 800 μm. Devices having microchannels with a width of 1 mm had lower; production than devices falling within the optimal range. Optimal channel depth is between 30 μm and 250 μm. Other examples include microchannels are in the range of 200 μm to 400 μm wide, and in the range of 150 μm to 250 μm deep. However, a wide range of channel depths, widths and lengths are possible in all of the polymer, ceramic, glass and metal/metal oxide embodiments, as supported by prior patents, patent applications and publications of the inventors.

Extensive testing of the miniature reactors of the invention has shown them to exhibit efficient ozone production. In other tests, ozone modules having 10-12 unit microchannel plasma wafers, each of which has 12 microchannels, were fabricated. These modules each produced 2-3 grams of ozone/hour but increasing the number of microchannels in each chip of the module to 24 increased the ozone production rate to 10 grams per hour. This value fits well the requirements for an 80 lb. washer in a commercial laundry.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the following claims.

The invention claimed is:

1. A modular microplasma microchannel reactor device, comprising:
a microchannel array of a plurality of microchannel plasma devices including electrodes arranged with respect to the plurality of microchannels to stimulate plasma generation in the plurality of microchannels upon application of suitable voltage wherein the electrodes are isolated from the microchannels by dielectric;
a gas inlet to the microchannels;
a gas product outlet from the microchannels; wherein a portion of the microchannels between the gas inlet and gas product outlet are covered by a cover; and
seals that seal the gas inlet and gas product outlet to provide fluid (gas) communication between the gas inlet and/or gas product outlet and another microchannel reactor device, wherein the cover and device are structured to be modular to join with additional reactor devices.

2. The device of claim 1, wherein one of the electrodes comprises the cover that seals the plurality of microchannels between the gas inlet and gas outlet.

3. A miniature microplasma reactor module, comprising a plurality of modular microplasma microchannel reactor devices of claim 2 held together by a housing to provide an air tight seal between reactor devices.

4. The module of claim 3, wherein all of the microchannel arrays are in fluid (gas) communication with each other.

5. A microplasma reactor system, comprising a plurality of the modules of claim 4 arranged in fluid communication with other modules in an array of miniature microplasma reactor devices.

6. The reactor system of claim 5, comprising a base plate with flow channels that interconnect columns of the array of miniature microplasma reactor devices.

7. The reactor system of claim 6, wherein the modules include structures to join with other modules and the base plate, and the base plate includes structures to align and join with modules.

8. The reactor system of claim 7, wherein the structures to join comprise complementary tongue and groove structures.

9. The reactor system of claim 7, wherein the structures to join comprise complementary male and female connector gas ports.

10. The reactor system of claim 7, comprising outlet plenums that provide outlets from a plurality of microplasma reactor devices in the array.

11. The reactor module of claim 3, further comprising a fan held within the frame.

12. The reactor module of claim 11, wherein the overall dimensions of the reactor device are 10×10×20 cm or less.

13. The device of claim 1, wherein the one of the electrodes is offset with respect to the plurality of microchannels to create a plasma actuator effect that stimulates flow through the microchannels.

14. The device of claim 1, wherein the electrodes are encapsulated within a metal oxide layer such that it is isolated from the microchannels.

15. The device of claim 1, wherein the microchannels comprise a flat bottom microchannels.

16. The device of claim 1, wherein the microchannel array is formed in polymer.

17. A miniature low profile microplasma reactor module, comprising a plurality of modular microplasma microchannel reactor devices mounted side-by-side upon a planar frame and sealed by a seal embedded in the planar frame, the planar frame further comprising feedstock and output channels to respectively supply feedstock to respective gas inlets defined at a same end of the plurality of reactor devices and receive gas product from respective gas product outlets defined at an opposite of the plurality of reactor devices, wherein the reactor devices comprise a microchannel array of a plurality of microchannel plasma devices including electrodes arranged with respect to the plurality of microchannels to stimulate plasma generation in the plurality of microchannels upon application of suitable voltage wherein the electrodes are isolated from the microchannels by dielectric;

a gas inlet as one of the respective gas inlets to the microchannels; and a gas product outlet as one of the respective gas product outlets from the microchannels; wherein a portion of the microchannels between the gas inlet and gas product outlet are covered by a cover.

18. A miniature microplasma reactor module, comprising a plurality of modular microplasma microchannel reactor devices held together by a housing to provide an air tight seal between reactor devices, further comprising a sprayer plate accepting output from the miniature reactor device, the sprayer plate including a plurality of microchannels that directs output of the miniature reactor device away from the device in a predetermined pattern, wherein the reactor devices comprise a microchannel array of a plurality of microchannel plasma devices including electrodes arranged with respect to the plurality of microchannels to stimulate plasma generation in the plurality of microchannels upon application of suitable voltage wherein the electrodes are isolated from the microchannels by dielectric;

a gas inlet as one of the respective gas inlets to the microchannels; and a gas product outlet as one of the respective gas product outlets from the microchannels; wherein a portion of the microchannels between the gas inlet and gas product outlet are covered by a cover, wherein the cover and device are structured to be modular to join with additional reactor devices.

19. The miniature reactor module of claim 18, held with a plastic mold and dimensioned to fit within an individual food package.

20. The miniature microplasma reactor module of claim 18, wherein the sprayer plate comprises a spiral or pinwheel design with curved microchannels.

21. A modular microplasma microchannel reactor device, comprising:

a microchannel array of a plurality of microchannel plasma devices including electrodes arranged with respect to the plurality of microchannels to stimulate plasma generation in the plurality of microchannels upon application of suitable voltage wherein the electrodes are isolated from the microchannels by dielectric;

a gas inlet to the microchannels; and a gas product outlet from the microchannels; wherein a portion of the microchannels between the gas inlet and gas product outlet are covered by a cover, wherein the cover and device are structured to be modular to join with additional reactor device, and wherein the microchannel array comprises a ladder structure with one or more cross channels connecting the plurality of microchannels to each other between opposite ends of the microchannels.

22. An ozone injection device comprising:

a miniature reactor module including a microchannel array of a plurality of microchannel plasma devices including electrodes arranged with respect to the plurality of microchannels to stimulate plasma generation in the plurality of microchannels upon application of suitable voltage wherein the electrodes are isolated from the microchannels by dielectric;

a gas inlet to the microchannels;

a gas product outlet from the microchannels; wherein a portion of the microchannels between the gas inlet and gas product outlet are covered by a cover, wherein the cover and device are structured to be modular to join with additional reactor devices;

a pump and oxygen concentrator for supplying oxygen to the miniature reactor module; and a water inlet and a mixer mixing ozone output from the miniature reactor device with water from the water inlet prior to outputting treated water out a water outlet.

23. The ozone injection device of claim 22, comprising a plurality of the miniature reactor modules and further comprising a power source and controller, wherein ones of the miniature reactor modules can be individually activated and deactivated.

24. The ozone injection device of claim 23, comprising a plurality of water outlets associated with individual ones of the miniature reactor modules.

25. A modular microplasma microchannel reactor device, comprising:

a microchannel array formed in a thin plate and being arranged with respect to electrodes for generation of plasma and isolated by dielectric from the electrodes;

a cover covering a central portion of the microchannel array, while leaving end portions of the microchannel array exposed;

a positioning tab extending from the thin plate for alignment of the reactor device with other reactor devices in a stack of reactor devices;

a seal to seal the cover to the thin plate; and a gas inlet and product outlet arranged to permit flow into, through and out of the microchannel array, wherein the cover and device are structured to be modular to join with additional reactor devices.

26. A plurality of modular microplasma microchannel reactor devices stacked together with O-rings sealing the reactor devices to each other around the gas inlet and product outlet, the reactor devices comprising:

a microchannel array arranged with respect to electrodes for generation of plasma and isolated by dielectric from the electrodes;

a cover covering a central portion of the microchannel array, while leaving end portions of the microchannel array exposed;

a gas inlet and product outlet arranged to permit flow into, through and out of the microchannel array;

wherein the cover and device are structured to be modular to join with additional reactor devices.

27. A plurality of modular microplasma microchannel reactor devices held in a frame or housing to form a miniature reactor, the frame or housing having inlet and outlets in gas communication with the gas inlet and product outlets of the reactor devices, the reactor devices comprising:

a microchannel array arranged with respect to electrodes for generation of plasma and isolated by dielectric from the electrodes;

a cover covering a central portion of the microchannel array, while leaving end portions of the microchannel array exposed; and a gas inlet and product outlet arranged to permit flow into, through and out of the microchannel array, wherein the cover and device are structured to be modular to join with additional reactor devices.

28. The miniature reactor of claim 27, wherein the frame or housing comprises ports for receiving feedstock gas and directing the feedstock gas into the reactor devices and an exit for outputting reactor product generated by the reactor.

29. The miniature reactor of claim 28, the reactor further comprising O-rings between the reactor devices and a top cover held by the frame or housing that exerts pressure on the plurality or reactors to seal respective outlets and inlets of the reactors.

30. A reactor system comprising a plurality of the miniature reactors of claim 28 interlocked, fluid connected, and electrically connected together upon a base plate, wherein the frame or housing of each miniature reactor is configured with grooves and tongues to interlock without other miniature reactors or the base plate, the ports being configured as male and female connectors on opposite ends of the frame or housing to mate with other miniature reactors or the base plate.

31. The reactor system of claim 30, wherein the frame or housing of each miniature reactor comprises electrical contacts to contact other miniature reactors or the base plate.

32. The reactor system of claim 31, wherein the base plate comprises flow channels and features to interlock miniature reactors to the base plate while maintaining gas flow, physical and electrical connections between the base plate and the miniature reactors.

* * * * *